(12) United States Patent
Hendrickson et al.

(10) Patent No.: US 11,770,984 B2
(45) Date of Patent: Sep. 26, 2023

(54) SYSTEM AND METHOD USING MULTILAYER QUBIT LATTICE ARRAYS FOR QUANTUM COMPUTING

(71) Applicants: Peter Carl Hendrickson, Reston, VA (US); Jadon Daniel Erwin, Herndon, VA (US)

(72) Inventors: Peter Carl Hendrickson, Reston, VA (US); Jadon Daniel Erwin, Herndon, VA (US)

(73) Assignee: KBR WYLE SERVICES, LLC, Houston, TX (US)

(*) Notice: Subject to any disclaimer, the term of this patent is extended or adjusted under 35 U.S.C. 154(b) by 274 days.

(21) Appl. No.: 17/090,747

(22) Filed: Nov. 5, 2020

(65) Prior Publication Data

US 2021/0142204 A1 May 13, 2021

Related U.S. Application Data

(60) Provisional application No. 62/933,148, filed on Nov. 8, 2019.

(51) Int. Cl.
*H10N 69/00* (2023.01)
*G06N 10/40* (2022.01)
*H10N 60/12* (2023.01)

(52) U.S. Cl.
CPC ............. *H10N 69/00* (2023.02); *G06N 10/40* (2022.01); *H10N 60/12* (2023.02)

(58) Field of Classification Search
CPC .................................................... G06N 10/40
See application file for complete search history.

(56) References Cited

U.S. PATENT DOCUMENTS

| | | | |
|---|---|---|---|
| 9,858,531 B1 | 1/2018 | Monroe et al. | |
| 10,248,491 B1 | 4/2019 | Zeng et al. | |
| 2017/0337155 A1 | 11/2017 | Novotny | |
| 2018/0114138 A1 | 4/2018 | Monroe et al. | |
| 2019/0229189 A1* | 7/2019 | Clarke | H01L 29/423 |
| 2021/0027188 A1* | 1/2021 | Nickerson | G06N 10/00 |
| 2022/0366287 A1 | 11/2022 | Hendrickson | |
| 2023/0015801 A1 | 1/2023 | Hendrickson et al. | |

OTHER PUBLICATIONS

A Bautista-Salvador et al 2019 New J. Phys. 21 043011 (Year: 2019).*
International Search Report and Written Opinion dated Mar. 23, 2021 for International Application No. PCT/US20/59192 filed Nov. 5, 2020 (20 pages).

(Continued)

*Primary Examiner* — Matthew L Reames
(74) *Attorney, Agent, or Firm* — Gary M. Machetta

(57) ABSTRACT

A quantum computing (QC) system that includes a plurality of qubits arranged substantially in a plurality of substantially planar regions that are substantially parallel to one another, at least some of the substantially planar regions including two or more qubits and one or more qubits of each substantially planar region configured to interact with one or more qubits of at least one other substantially planar region.

20 Claims, 38 Drawing Sheets

(56) References Cited

OTHER PUBLICATIONS

Markus J. Storcz, "Intrinsic Phonon Decoherence and Quantum Gates in Coupled Lateral Quantum-Dot Charge Qubits", Physical Review B72, 23521, Physics Department, Arnold Sommerfeld Center for Theoretical Physics and Center for NanoScience, Ludwig-Maximilians-Universitat, Theresienstrasse 37, D-80333 Munchen, Germany, (2005) 10 pages.
J. Chiaverini et al., "Surface-Electrode Architecture for Ion-Trap Quantum Information Processing," Quant. Inf. Comp. vol. 5, 419 (2005).
J.I. Cirac and P. Zoller, "Quantum Computations with Cold Trapped Ions," Phys. Rev. Lett. vol. 74 (20) (1995).
J.I. Cirac and P. Zoller, "A scalable quantum computer with ions in an array of microtraps," Nature, vol. 404, p. 579 (2000).
S. Debnath et al., "Demonstration of a small programmable quantum computer with atomic qubits," Nature, vol. 536, p. 63 (2016).
C. Figgatt et al., "Parallel entangling operations on a universal ion-trap quantum computer," Nature, vol. 571 (2019).
T.P. Harty et al., "High-fidelity preparation, gates, memory, and readout of a trapped-ion quantum bit," Phys Rev. Lett. vol. 113, 220501 (2014).
C.W. Hogle et al., "Characterization of Microfabricated Surface Ion Traps," Sandia National Lab., SAND2017 6113C (2017).
A. Kitaev, "Anyons in an exactly solved model and beyond," Ann. Phys. vol. 321, 2 (2006).
N.M. Linke et al., "Experimental comparison of two quantum computing architectures", PNAS, vol. 114, No. 13 (2017).
Y. Lu et al., "Scalable global entangling gates on arbitrary qubits," Nature, vol. 571 (2019).
M. Mielenz et al., "Arrays of individually controlled ions suitable for two-dimensional quantum simulations," Nature Communications, 7:11839 (2016).
T. Monz et al., "Realization of the Quantum Toffoli gate with Trapped Ions," Phys. Rev. Lett. vol. 102, 040501 (2009).
C. Ospelkaus et al., "Trapped-ion quantum logic gates based on oscillating magnetic fields," Phys Rev. Lett. vol. 101, 090502 (2008).
C.E. Pearson et al., "Experimental investigation of planar ion traps," Phys. Rev. A vol. 73, 032307 (2006).
T. Roy et al., "A programmable three-qubit superconducting processor with all-to-all connectivity," aeXiv:1809.00668v1 [quant-ph] Sep. 3, 2018.
R. Schmied, et al.. "Optimal Surface-Electrode Trap Lattices for Quantum Simulation with Trapped Ions," arXiv:0902.1686v2 [quant-ph] May 28, 2009.
R. Schmied et al. "Quantum simulation of the hexagonal Kitaev model with trapped ions," New J. Phys. 13 115011 (2011).
D.J. Wineland et al., "Experimental issues in coherent quantum-state manipulation of trapped atomic ions," J. Res. Natl. Inst. Stand. Technol. vol. 103, 259 (1998).
S.E. Anderson, et al., Physical Review Letters, "Trapping Rydberg Atoms in an Optical Lattice," Phys. Rev. Lett. 107, 263001 (2011) 6 pages.
R. Samajdar, PNAS, "Quantum Phases of Rydberg Atoms on a Kagome Lattice," Proc. Natl. Acad. Sci. U.S.A. 118, e2015785118 (2021) 9 pages.
M. Storcz, Physics Department, Arnold Sommerfeld Center for Theoretical Physics, and Center for Nanoscience, "Intrinsic Phonon Decoherence and Quantum Gates in Coupled Lateral Quantum-Dot Charge Qubits," Physical Review B 72, 235321 (2005) 10 pages.
D. Stick et al., Nature Physics, "Ion Trap in a Semiconductor Ship" Nature Phys 2, 36-39 (2006) 4 pages.
P. Maunz, Sandia National Laboratories, "Characterization of a High-Optical-Access Surface Trap Optimized for Quantum Information Processing," SAND2015-1045C (2015) 24 pages.
I. Bloch, Nature, "Quantum Coherence and Entanglement with Ultracold Atoms in Optical Lattices," Nature 453, 1016-1022 (2008) 8 pages.
C. E. Bradley et al., Physical Review X, "A 10-Qubit Solid-State Spin Register with Quantum Memory Up to One Minute," Phys. Rev. X 9, 031045 (2019) 12 pages.
M. Saffman et al., Reviews of Modern Physics, "Quantum Information with Rydberg Atoms," Rev. Mod. Phys. 82, 2313 (2010) 51 pages.
K. Maller et al., Physical Review A, "Rydberg-Blockade Controlled-NOT Gate and Entanglement in a Two-Dimensional Array of Neutral-Atom Qubits," Phys. Rev. A 92, 022336 (2015) 16 pages.
D. Petrosyan et al., Physical Review A, "High-Fidelity Rydberg Quantum Gate Via a Two-Atom Dark State," Phys. Rev. A 96, 042306 (2017) 11 pages.
M. Khazali and K. Molmer, Physical Review X, "Fast Multiqubit Gates by Adiabatic Evolution in Interacting Excited-State Manifolds of Rydberg Atoms and Superconducting Circuits," Phys. Rev. X 10, 021054 (2020) 16 pages.
I. Bloch, Nature Physics, "Ultracold Quantum Gases in Optical Lattices," 1, 23-30 (2005) 9 pages.
T.M. Graham et al., Physical Review Letters, "Rydberg-Mediated Entanglement ina Two-Dimensional Neutral Atom Qubit Array," Phys. Rev. Lett. 123, 230501 (2019) 7 pages.

\* cited by examiner

|  | QFPGA I | | | |  | QASIC I | | | |
|---|---|---|---|---|---|---|---|---|---|
|  | 13 | 4 | 13 | 4 |  | 13 | 4 | 4 | 13 |
|  | 4 | 13 | 4 | 13 |  | 4 | 10 | 10 | 4 |
|  | 13 | 4 | 13 | 4 |  | 4 | 10 | 10 | 10 |
|  | 4 | 13 | 4 | 13 |  | 13 | 4 | 10 | 10 |
| Total Qubits/ 16-Cell Array | 136 | | | | Total Qubits/ 16-Cell Array | 133 | | | |

|  | QFPGA II | | | |  | QASIC II | | | |
|---|---|---|---|---|---|---|---|---|---|
|  | 10 | 10 | 10 | 10 |  | 13 | 4 | 10 | 10 |
|  | 10 | 10 | 10 | 10 |  | 4 | 10 | 10 | 10 |
|  | 10 | 10 | 10 | 10 |  | 10 | 10 | 10 | 4 |
|  | 10 | 10 | 10 | 10 |  | 10 | 10 | 4 | 13 |
| Total Qubits/ 16-Cell Array | 160 | | | | Total Qubits/ 16-Cell Array | 142 | | | |

SYSTEM AND METHOD USING MULTILAYER QUBIT LATTICE ARRAYS FOR QUANTUM COMPUTING

BACKGROUND

Field

This application is generally directed to quantum computing (QC), and more particularly to quantum computer architectures employing lattice array structures of more than one dimension.

Description of the Related Art

Technology paths toward scalable quantum computing have been diverse. Demonstrated performance in the various figures of merit vary widely according to the type of physical quantum bit (also referred to as a "qubit") employed by each approach. Approaches based on either trapped ions or on superconducting qubits have consistently led the field through more than two decades.

SUMMARY

Certain implementations disclosed herein provide a quantum computer architecture employing a lattice array structure of more than one dimension for implementing and interconnecting quantum gates in which more than two qubits can be simultaneously entangled. Certain implementations disclosed herein provide quantum microprocessor configuration and gate array design platforms for quantum processing chips, analogous to field programmable gate arrays (FPGAs) which can advantageously provide a degree of reconfigurability. Certain implementations disclosed herein provide quantum microprocessor configuration and gate array design platforms for quantum processing chips, analogous to application specific integrated circuits (ASICs) which can advantageously be optimized for a specified application and can advantageously provide custom design flexibility.

Certain implementations disclosed herein comprise lattice configurations comprising multiple fully-connected qubits arranged as arrays of three-dimensional (3-D) lattice structures (e.g., cells), with simultaneous multi-qubit gate operations enabled by qubits arrayed in geometric layouts. For example, certain implementations can be configured as multiple two-dimensional (2-D) (e.g., planar) qubit arrays (e.g., layers) that are substantially parallel to one another and that form arrays of three-dimensional (3-D) cells. For another example, certain other implementations can be configured as multiple one-dimensional (1-D) (e.g., linear) qubit arrays (e.g., rows and columns; lattices; chains) that are substantially parallel to one another. In both of these examples, the arrays of cells can be analogized to or referred to as 3-D crystal structures. While various implementations are described herein as utilizing trapped ion qubits (e.g., in microchip structures) to illustrate the nature of quantum interactions to be utilized (e.g., optimized), other implementations can use one or more alternative qubit technologies.

Certain implementations disclosed herein provide a quantum computing (QC) system comprising a plurality of qubits arranged substantially in a plurality of substantially planar regions (e.g., planes; layers) that are substantially parallel to one another, at least some of the substantially planar regions comprising two or more qubits and one or more qubits of each substantially planar region configured to interact with one or more qubits of at least one neighboring substantially planar region. For example, the QC system can comprise a first substrate and a second substrate, the first substrate and the second substrate substantially parallel to one another, and the QC system can further comprise a multiple-qubit gate array comprising the plurality of qubits arranged as a plurality of multiple-qubit gates positioned in a region between the first substrate and the second substrate. The qubits of the multiple-qubit gate array can comprise surface electrode traps configured to contain ions (e.g., charged atoms; charged molecules) at or near a surface of at least one of the first and second substrates, and can be arranged substantially in a plurality of substantially planar regions (e.g., planes; layers; levels), with at least some of the qubits of at least one substantially planar region configured to interact (e.g., to be quantum-mechanically entangled) with at least some of the qubits of at least one other (e.g., neighboring) substantially planar region.

Certain implementations disclosed herein provide a quantum computing (QC) system comprising a plurality of qubits arranged substantially in a plurality of linear arrays that are substantially parallel to one another, at least some of the linear arrays comprising two or more qubits and one or more qubits of each linear array configured to interact with one or more qubits of at least one neighboring linear array. For example, the QC system can comprise a multiple-qubit gate array comprising the plurality of qubits arranged as a plurality of multiple-qubit gates positioned in a region between two or more substrates. The qubits of the multiple-qubit gate array can comprise surface electrode traps configured to contain ions (e.g., charged atoms; charged molecules) at or near a surface of at least one of the substrates, and can be arranged substantially in a plurality of linear arrays, with at least some of the qubits of at least one linear array configured to interact (e.g., to be quantum-mechanically entangled) with at least some of the qubits of at least one other (e.g., neighboring) linear array.

BRIEF DESCRIPTION OF THE DRAWINGS

The accompanying drawings, which are incorporated in and constitute a part of this specification, illustrate one or more implementations described herein and, together with the description, explain these implementations.

FIG. 9 shows four tables comparing the total number of qubits for various 4×4 cell arrays in accordance with certain implementations described herein.

DETAILED DESCRIPTION

Overview

Figure 1A:
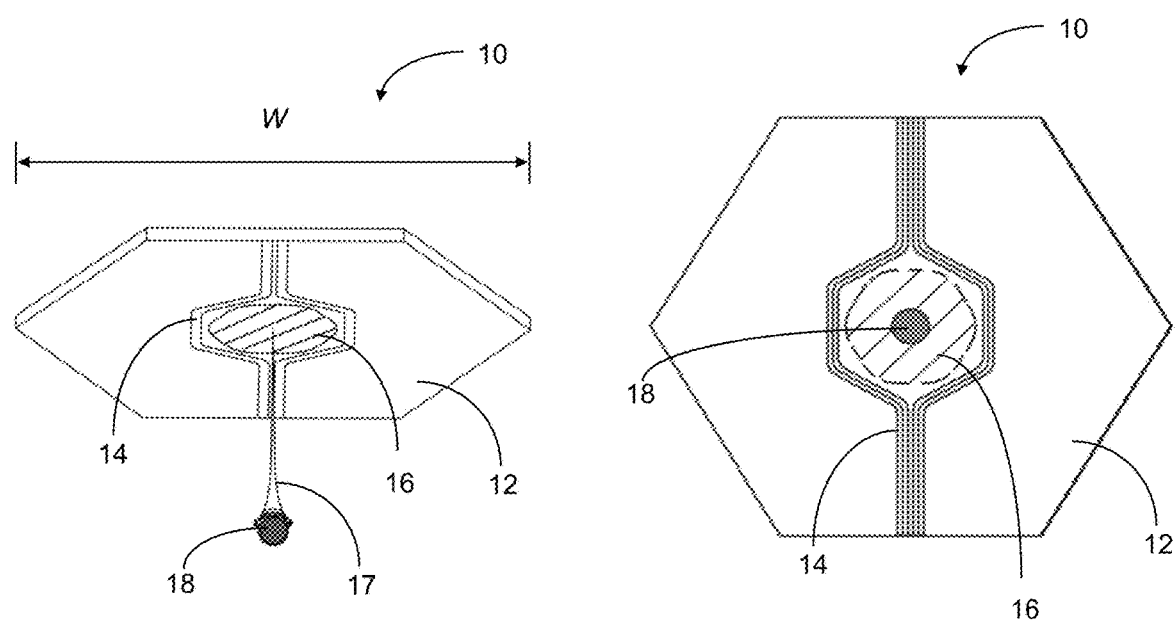
FIGS. 1A-1C and 2A-2F schematically illustrate various aspects of example multiple-qubit gates (e.g., cells) in accordance with certain implementations described herein.

Certain implementations of the quantum computing (QC) system described herein advantageously provide a multi-layer architecture to enable optimal numbers of qubits to be entangled simultaneously between nearest neighbors and next-nearest neighbors. Certain implementations include electrical and optical access channels for addressing, control, detection, and readout as are needed to engineer scalable quantum processors. Arrays of qubits that are fully connected provide more efficient, flexible choices for executing quantum algorithms in hardware than designs in which entangled gate operations are limited to specific pairs, due to type of qubit employed or their layout. This improved efficiency and flexibility grows rapidly with the number of qubits in an array. Adding a capability to perform gate operations involving more than two qubits at a time can significantly accelerate the efficiency gains over designs limited to one- and two-qubit gates, tens of which can be replaced with one four-qubit gate. Certain implementations described herein use multiple qubit arrays in (e.g., multiple directly connected planar arrays and/or linear arrays) to advantageously avoid problems of one- and two-dimensional geometry configurations (e.g., limits on connectivity; crowding of electrodes needed to control each qubit in a gate, which can greatly extend gate spacing). In certain implementations, multi-dimensional cells of qubits are formed that resemble crystals, such as pyrochlores. Inverting qubits and cells (e.g., in alternating rows) can enable closer cell tiling and space for optical access, controls and readout. Utilizing many qubits to participate per gate can also reduce requirements of circuit depth, error correction and interference mitigation. Interchangeable component cells can enable quantum FPGA (QFPGA) and ASIC (QASIC) chips.

Certain implementations of the QC system described herein comprise multi-layer configurations comprising multiple fully-connected qubits arranged as arrays of three-dimensional (3-D) lattice structures (e.g., cells) with simultaneous multi-qubit gate operations enabled by qubits arrayed in geometric layouts. For example, multiple planar or linear qubit arrays in layers (e.g., rows and columns; lattice; chains) can be substantially parallel to one another and can form arrays of 3-D cells that can be analogized to or referred to as crystal structures. In certain implementations, the qubits can be suspended (e.g., trapped) equivalently above and below (or over and under; left and right of; etc.) multiple co-aligned qubit containment zones (e.g., facing parallel ion trap arrays) to enable optimal coherent connectivity (e.g., entanglement) directly between nearest neighbor qubits, next-nearest neighbor qubits, etc. across multiple array substantially planar regions (e.g., layers; levels; planes) without requiring photonic or other interconnects entailing lossy conversions of in situ processing qubits to other species or data bits or significant time delays. Certain such implementations utilize geometrically symmetric cellular structures that provide a capability to perform gate operations involving more than two qubits at a time, which can significantly accelerate the efficiency gains over designs limited to one- and two-qubit gates, tens of which can be replaced with one four-qubit gate. Certain implementations described herein use qubit arrays in multiple directly connected substantially planar regions (e.g., layers; levels; planes) to advantageously avoid problems of one- and two-dimensional geometry configurations (e.g., limits on connectivity; crowding of electrodes needed to control each qubit in a gate, which can greatly extend gate spacing). In certain implementations, multi-dimensional cells of qubits are formed that resemble crystals, such as pyrochlores. Inverting qubits and cells (e.g., in alternating rows) can enable closer cell tiling and space for optical access, controls and readout. Utilizing many qubits to participate per gate can also reduce minimize requirements of circuit depth, error correction and interference mitigation. Interchangeable component cells can enable quantum FPGA (QFPGA) and ASIC (QASIC) chips.

While various implementations are described herein according to the physics of trapped ion qubit approaches, other qubit approaches (e.g., superconducting qubits) can also be used in accordance with certain implementations described herein without loss of generality.

Certain implementations of the QC system described herein comprises a plurality of multiple-qubit three dimensional (3-D) gate cells, each cell comprising at least three qubits that can be fully connected simultaneously across three dimensions, and a plurality of multiple-qubit cells configured for gate operations of two or more of the multiple-qubit gates. The QC system of certain such implementations can comprise multiple co-aligned qubit containment zones, such as facing parallel ion trap arrays, that enable optimal coherent connectivity or entanglement directly between nearest neighbor qubits, next-nearest neighbor qubits, etc. across multiple array layers, levels or planes without requiring photonic or other interconnects. The multiple-qubit cells can be configured using geometric symmetry to enable multiple-qubit gates to be affected natively, in one gate operation, without reliance on concatenations of multiple one- and two-qubit gates. Leveraging the symmetry of equilateral coupling distances between multiple qubits in a cell enables more than two entangled qubits at a time to perform gate operations that would otherwise require many more qubit gate operations comprising only one- and two-qubit gates. The multiple-qubit cells can comprise or include asymmetric 3-D structures with complementary bases and caps arranged in alternating orientations up and down, left and right, or other opposing-face orientations. This alternating arrangement of asymmetric 3-D cells can enable interleaving of non-identical neighboring cell bases and caps including their extended or overlapping electrode regions to yield optimal tiling and spacing of cells of given size or area. Lattices or arrays of the multiple alternating orientations of asymmetric cell structures can reduce problems of one- and two-dimensional geometry configurations such as: crowding of electrodes needed to control each qubit in a gate, which detrimentally increases gate spacing; limited optical accesses; complicated stray light management; limited electrical connectivity; and others. Qubits and cells can be inverted in alternating rows in ways that enable closer cell tiling and open intercell channel spaces for optical access, controls and readout. The symmetric or equilateral coupling geometries of the multiple qubits per cell can enable more complex quantum gates to be performed in a single gate operation and can additionally reduce requirements of circuit depth, error correction and interference mitigation. The interchangeable component cells can enable quantum FPGA (QFPGA) and ASIC (QASIC) chips and can be highly reconfigurable.

Certain implementations of the QC system described herein advantageously provide a three-dimensional (3-D) layout of qubits and/or qubit gates that facilitate many more qubits and/or qubit gates being used for computations than are provided using one-dimensional (1-D) or two-dimensional (2-D) layouts (see, e.g., J. I. Cirac and P. Zoller, "A scalable quantum computer with ions in an array of microtraps," Nature, Vol. 404, p. 579 (2000); J. Chiaverini et al., Quant. Inf. Comp. Vol. 5, 419 (2005)). For example, certain implementations described herein provide a 3-D layout of qubit gates, each comprising multiple ions (e.g., four or more simultaneously entangled ions), while providing sufficient spacing to facilitate electrical connections and optical pathways for addressing, manipulation, control, readout, and potential sideband cooling of each qubit, and providing line of sight access angles.

When a particular arrangement or set of qubits allows for any qubit to be quantum mechanically entangled directly with any other qubit in the set, the qubits can be described as being "fully connected." Even a small number of qubits comprising ions that are fully connected in a one-dimensional (1-D) linear ion trap can demonstrate measurably greater potential processing power than can the same number of qubits that are only pair-wise connected (see, e.g., N. M. Linke et al., "Experimental comparison of two quantum computing architectures", PNAS, Vol. 114, no. 13 (2017)).

Quantum computing (QC) designs demonstrated over the past two decades indicate that the parameters which most affect how quickly a quantum computer can outperform its classical computer counterpart are not based simply on how many qubits are wired together in some fashion. This is exemplified by the greater degree of interest in circuit-model QC hardware, which often has less than one-hundredth of the number of qubits claimed by the leading quantum annealing approach that does not perform a single gate operation. Demonstrated performance of such systems has come down to qubit fidelities (e.g., how precisely the system can perform gate operations), how the qubits are interconnected, and how much overhead is used to allow the qubits to work together to compute solutions to hard problems.

One-qubit gates simply entail flipping a qubit by itself from "0" to "1" or to a special quantum superposition of "0" and "1". Two-qubit gates connect two qubits using superposition combined with quantum entanglement such that anything done to one of the qubits affects the other. In such a two-qubit gate, a target qubit may start out in state "0" or state "1", and can be in any superposition of "0" and "1" (e.g., halfway between "0" and "1"). For example, the function of a quantum controlled-NOT (CNOT) gate is to flip the target qubit if the control qubit is in state "1"; otherwise it does nothing. One- or two-qubit gates can be implemented directly in many different quantum gate-based architectures. For more complex gate operations, implementations that can entangle more than two qubits at once can have a significant impact on the total number of qubits and steps performed to effect the operation and the algorithms that incorporate them (see, e.g., C. Figgatt et al., "Parallel entangling operations on a universal ion-trap quantum computer," Nature, Vol. 571 (2019); Y. Lu et al., "Global entangling gates on arbitrary qubits," Nature, Vol. 571 (2019)). Measurable reductions in the numbers of qubits and steps used up front can, in some instances, lead to dramatic reductions in the overhead for achieving successful outcomes. One example would be a prototype demonstration that could give solutions to otherwise intractable problems without extensive error correction and with fewer ancillas, even part of the time.

Certain implementations described herein use multiple fully connected, high-fidelity qubits. The advantages of such certain implementations (e.g., how much more efficient a particular quantum gate operation can be, as opposed to using combinations of one- and two-qubit gates) can be illustrated by considering an example quantum triply-controlled-NOT ($C^3NOT$) gate comprising four fully connected, high-fidelity qubits. The $C^3NOT$ gate is also called a super-Toffoli gate. In this example $C^3NOT$ gate, three control qubits must all be in a specified state (e.g., "1,1,1") in order to flip a fourth target qubit from "1" to "0". When combined with one or more single-qubit gate operations, such multiqubit quantum gates can be used to complete a universal set for quantum computing. Multiply-controlled NOT gates are described in reference sources generally as comprising extended series of one- and two-qubit gate operations (see, e.g., M. A. Nielsen and I. L. Chuang, "Quantum Computing and Quantum Information," 1st ed. (Cambridge Univ. Press, 2000)). The extent to which these one- and two-qubit gate series increase even more in physical implementations depends on type of qubits used and on how many qubits can be fully connected and entangled with one another. However, a $C^3NOT$ gate implemented using four fully-connected, multiply-entangled ions at the same time, in an appropriate physical layout, can be configured with a small fraction of the number of the quantum gate operations used in a $C^3NOT$ gate implemented only with one- and two-qubit gates. This can be done by starting with an extension of methods described for implementing the simpler $C^2NOT$ Toffoli gate (see, e.g., J. I. Cirac and P. Zoller, "Quantum Computations with Cold Trapped Ions," Phys. Rev. Lett. Vol. 74 (20) (1995)) and later demonstrated (see, e.g., T. Monz et al., "Realization of the Quantum Toffoli gate with Trapped Ions," Phys. Rev. Lett. Vol. 102, 040501 (2009)). The three-qubit $C^2NOT$ implementation already exhibited a significant reduction in number of contributing gates and time required to complete the full gate operation, while yielding an improvement in net fidelity over the concatenation of one- and two-qubit gates, even if they were of much higher individual fidelities, due to aggregated gate errors. This three-qubit gate can be realized in a linear trap without a strong requirement for geometric symmetry. In contrast, certain implementations described herein provide CnNOT gates by exploiting the full 3-D symmetries of the designs described herein. In this way, the improved efficiency example referenced above can be greatly multiplied according to the number of controls in each CnNOT gate through concomitant reductions in quantum gates needed to implement them. Other multiply-controlled gate operations, including phase rotations, can exhibit similar improvements in efficiency using a physical configuration that involves more than two entangled qubits simultaneously. These improvements up front can greatly reduce error correction.

Even the highest quality qubits exhibit noticeable error rates, which can be small on a per-qubit basis but get multiplied by the number of gates that are used to run an algorithm. When the aggregate error rate reaches a threshold where error correction is required to perform even a small set of quantum operations with reasonable chance of giving a reliable result, the efficiency of the architecture immediately drops in proportion to the amount of overhead used for the error correction.

For a small scale quantum computer having a few hundred relatively high quality qubits intended to perform logic operations, the overhead of error-correction qubits plus ancillas can represent an increase in the number of qubits of one order of magnitude or roughly a factor of ten, with a proportionate decrease in efficiency. For larger scale systems, the overhead can increase further to multiple orders of magnitude. However, in certain implementations described herein, a quantum computer that benefits from aggregate efficiencies of fully-connected, high-quality qubits and employs multi-qubit gate operations (e.g., performed natively by exploiting multi-dimensional geometry) can use significantly fewer steps and significantly fewer total numbers of qubits. As used herein, the term "native" gate operations indicates that more than two qubits can participate at the same time, by virtue of a geometric layout. Certain native multi-qubit gate implementations described herein can advantageously perform algorithms without using extensive error correction overhead. In addition, significant improvements in overall design efficiency, due to reduced overhead, can be achieved, using multiple orders of magnitude fewer quantum resources, both to perform basic quantum computing algorithms or subroutines and to show practical utility with increased speed as compared to classical computing systems.

To date, most QC systems using trapped ions employ one-dimensional (e.g., linear) traps, which can then be interconnected electrically or photonically (see, e.g., U.S. Pat. No. 9,858,531; Debnath et al., "Demonstration of a small programmable quantum computer with atomic qubits," Nature, Vol. 536, p. 63 (2016)). Such 1-D traps enable a linear chain of qubits to be fully connected within a common potential well or trapping zone. The extent of full connectivity is limited by how many qubits can be chained together before the coupling strength between qubits at or near opposite endpoints of the linear chain is too weak to be usable for reliable multi-qubit gate operations, so it can be desirable to create interconnects between multiple linear traps of limited lengths. Optical interconnects, for example, can be employed by transferring a qubit state from an ion to a photon, then sending the photon to another linear trap where the quantum state is transferred to another ion. One type of protocol that is commonly used for such a process is termed "quantum teleportation." Such interconnections impart time delays and potential inefficiencies in the conversions (e.g., from a trapped ion qubit to a photon, and to a second trapped ion). Certain implementations described herein advantageously provide an alternate configuration to optimize more direct qubit-to-qubit interactions simultaneously than can be done efficiently using linear or 2-D elements with optical interconnects. When scaling up to larger numbers of qubits, certain such implementations can advantageously reduce or stave off the number of optical interconnections between nodes with their associated penalties (e.g., time delays; ion-photon conversion losses).

Rectangular two-dimensional (2-D) grid configurations have been previously adopted for some trapped ion approaches, as well as for superconducting qubit (SCQ) schemes. However, the interactions between qubits have been limited to one- and two-qubit operations that occur within the trapped ion grid lanes (e.g., by shuttling qubits in and out of lanes through intersections). Such approaches rely on significant redundancy to add the degree of fault tolerance for raising the probability of success in running an algorithm to usable levels. For example, some approaches use global addressing of ensembles of qubits, which are shuttled in and out of aligned intersections in a grid in order to effect a single one- or two-qubit operation redundantly among the many qubits, and then average to reduce errors. The overhead in such an approach, in terms of numbers of redundant qubits for effecting a single logic operation with sufficient fidelity, grows rapidly with the scale of the logic operations to be performed by the quantum computer. Conversely, in certain implementations described herein, entanglement between more than two qubits is enabled by having the qubits arranged in two or more dimensions, to be involved simultaneously and to effect multi-qubit gate operations directly or natively.

To distinguish certain implementations described herein from other approaches in which descriptive terms and visual layouts may appear similar, it is noted that the overall layout of 2-D periodic crystal structures, such as triangular lattice Penning traps (e.g., a surface of periodic electropotential wells into which ions can be placed to form an extended 2-D crystal or triangular lattice; useful for studying the physics of many-body interactions but not for implementing gate operations between multiple qubits; and hexagonal Kitaev models can resemble, but are different from, portions (e.g., single layers) of certain multi-layer implementations described herein (see, e.g., A. Kitaev, *Ann. Phys.* Vol. 321, 2 (2006); R. Schmied et al. *New J. Phys.* 13 115011 (2011)("Schmied 2011")). However, such 2-D periodic crystal structures are significantly different in design complexity and purpose to certain implementations described herein. For example, such crystal lattice structures have been designed only for simulations of quantum systems. Such structures are generally not intended to perform gate operations, but can be used to form energy topologies that mimic those of the quantum system to be modeled (e.g., to find the lowest electron energy configuration of a given molecule). In particular, a quantum simulator having a 2-D hexagonal lattice of ions (e.g., following the Kitaev model) generally can use fewer electrode structures than the number of electrode structures of a "full-up" quantum computer capable of quantum gate operations. Therefore, the shapes of the electrode structures of quantum simulators are less affected by overall design constraints than are the shapes of electrode structures for scalable gate-based quantum computing.

Nevertheless, algorithms can be used to help design (e.g., optimize) the electrode structures for trapping and holding individual ions in a periodic lattice (e.g., for individual trapping zones in a larger trapped ion architecture) for a gate-model quantum computer (see, e.g., R. Schmied, et al. *Phys Rev. Lett.* 2009 ("Schmied 2009")). One general guideline for electrode structure design obtainable from Schmied 2009 is that, given M traps (e.g., microtraps) per unit cell, the number of surface patch electrodes generally is at least 8M for full control and for effective gate operations.

In addition, crowding of the surface electrodes for controlling each ion of a 2-D layer of trapped ions for gate operations can arise. Such crowding can be due to the areas of the eight or more surface electrodes that provide full control of an ion in its electropotential well, limiting how closely ion trapping zones can be placed together and still allow for strong coupling for effective gate interactions. The coupling strength is highly dependent on the inter-ion distance (d), with the coupling strength or the exchange frequency $\Omega_{ex}$ rolling off as $1/d^3$ as shown in the equation:

$$\Omega_{exch} = \frac{q_1 q_2}{4\pi\varepsilon_0 \sqrt{m_1 m_2 \omega_1 \omega_2}\, d^3}$$

where $\Omega_{exch}$ is the exchange frequency or coupling strength, and for the most general case in which more than one ion species may be used, $q_1$ is the charge of an ion in a first electropotential well, identified here as potential well "1", $q_2$ is the charge of an ion in a second potential well identified here as potential well "2", $m_1$ and $m_2$ are the masses of the ions in potential wells 1 and 2, respectively, $\omega_1$ and $\omega_2$ are the frequencies of potential wells 1 and 2, respectively, and d is the distance between the ions (see, e.g., D. J. Wineland et al., *J. Res. Natl. Inst. Stand. Technol.* Vol. 103, 259 (1998)).

Certain implementations described herein advantageously facilitate solutions to other hardware challenges, which can grow rapidly and appear daunting or infeasible when designing gate-model QC structures that are scaled up from 2-D trapped ion lattices. For example, certain implementations described herein integrate optical elements (e.g., lasers; optical ports; fibers; detectors) into the QC structure for addressing, manipulation, readout, and potential sideband cooling of each qubit, and provide line of sight access angles.

Certain implementations described herein advantageously provide scalable hardware configurations on which it is possible to directly "write" and run complex quantum algorithms by enabling simultaneous entanglement between optimal numbers of neighboring qubits. In certain implementations, a multidimensional quantum gate implementation, analogous to conventional firmware such as a field programmable gate array (FPGA), can be written directly in the form of multi-qubit gates and reprogrammed flexibly.

Certain implementations described herein advantageously enable multiply controlled quantum gate operations to be run natively by exploiting multi-dimensional geometry. In certain implementations, the quantum gate operations are run on a quantum firmware platform in the least number of steps (e.g., without resorting to concatenations of one- and two-qubit gate operations to effect a multiply controlled NOT operation).

Certain implementations described herein advantageously provide a realizable engineering configuration that enables the quantum firmware platform to be scaled up as needed by integrating electrical and optical channels for full control and readout of each qubit in a circuit-model architecture to enable universal quantum computing.

Certain implementations described herein advantageously provide a multi-layer quantum computing structure configured to enable optimal numbers of qubits to be entangled simultaneously between nearest neighbors, next-nearest neighbors, and potentially beyond. Certain such implementations include electrical and optical access channels for addressing, control, and readout of qubits in scalable quantum processors. For example, arrays of qubits that are fully connected advantageously provide more efficient, flexible choices for executing quantum algorithms in hardware than do other designs in which entangled gate operations are limited to specific pairs (e.g., due to the type of qubit employed or their layout). This improved efficiency and flexibility can grow rapidly with the number of qubits in an array.

Certain implementations described herein are advantageously able to perform gate operations involving more than two qubits at a time, thereby providing significant improvements of efficiency over previous designs that are limited to one- and two-qubit gates (e.g., by replacing tens of such gates with one four-qubit gate). Certain implementations described herein advantageously overcome connectivity limitations found in one- and two-dimensional geometries using trapped ions. For example, arraying qubits in multiple qubit arrays (e.g., multiple planar and/or linear qubit arrays) with direct connectivity (e.g., entanglement) between the qubit arrays can solve the problem of significant time delays and inefficiencies of converting from ion qubits to photonic qubits and back again to continue scaling up from a few tens of ions in a 1-D chain. In addition, array qubits in multiple planes can solve issues arising from crowding of electrodes for controlling each qubit in a gate, which otherwise greatly extends gate spacings. For another example, selectively inverting electropotential wells between facing surface planes can enable a maximum number of neighboring qubits to participate in a gate operation.

Certain implementations described herein advantageously utilize a first set of ions trapped above a first surface and a second set of ions trapped below a second surface, the second surface facing the first surface and at least some ions of the first set of ions entangled with at least some ions of the second set of ions. By integrating and interleaving the first and second sets of trapped ions and by adjusting the trap height of a central ion of the qubit gate relative to ions at vertices of the qubit gates, certain implementations advantageously provide multi-dimensional entangling geometries that resemble complex 3-D crystalline structures (e.g., a pyrochlore). In addition, the space between the first and second surfaces of certain implementations advantageously provides optical access from the sides for addressing the qubits globally or locally, as well as optical access for readout by detectors. The multiple-ion qubit gates (e.g., cells) can be constructed asymmetrically such that a cap of each cell (e.g., either up or down) provides additional space for integrating optics and electronics to be used to initialize, manipulate, and read out qubits individually or as ensembles. For example, rows of these multiple-ion qubit gates (e.g., cells) can be interleaved, with alternating "up" and "down" cell orientations to form channels that provide additional multi-angle optical accesses and electronic control lines between rows of cells. Since gravity is not the dominant force on trapped ions, the full configuration can be oriented at any angle (e.g. tilted 90 degrees, where "up" and "down" are replaced "left" and "right" etc.). For other types of qubits, this general directional insensitivity of trapped ions may not apply to the same degree, and other types of qubits may confine the choices of orientation.

Example Implementations

Certain implementations described herein utilize multi-dimensional cells of qubits, which can resemble 3-D crystal structures (e.g., pyrochlores). In certain implementations, inverting the cells in alternating rows enables closer cell tiling and space for optical access, controls, and readout. Certain implementations utilize many qubits per gate, advantageously reducing (e.g., minimizing) circuit depth, error correction, and interference mitigation. Certain implementations utilize interchangeable component cells which can advantageously enable quantum FPGA (QFPGA) and quantum ASIC (QASIC) chips.

While the physical configurations of certain implementations are described herein as using high fidelity trapped ion qubits (e.g., with low error rates), any type of qubit (e.g., naturally occurring; artificially formed) that can be entangled in multiple dimensions simultaneously with multiple other qubits can be used in accordance with certain implementations described herein. Examples of qubits compatible with certain implementations described herein include but are not limited to: subatomic particles; neutral atoms; ions; neutral molecules; charged molecules; Bose-Einstein condensates; electrons; electron holes; excitons; magnetic qubits; nitrogen-vacancy centers in diamond; phonons; photons; quantum dots; Rydberg atoms; spins in silicon; and possibly superconducting qubits. In certain implementations, the qubits are suitable to effect gate operations directly (e.g., natively), between more than two qubits in the specified configuration. For example, the physical architecture of certain implementations can advantageously provide complex gate operations directly, such as a multiply-controlled NOT or phase rotation, without resorting to serial concatenations of one- and two-qubit gates.

The trapped ion qubits utilized in certain implementations described herein, illustrate the nature of quantum interactions to be optimized. Germane figures of merit that trapped ions exhibit include but are not limited to: (i) the fact that they are identical within a given species and therefore extensive calibration or tuning can advantageously be avoided, (ii) the ability to form qubits that have very long-lived stability, and (iii) continued, demonstrated high fidelity gate operations as compared to competing qubit technologies. In certain implementations described herein, simultaneous multi-qubit gate operations can be enabled by ions arrayed in 3-D geometric layouts of multiple identical, fully-connected qubits.

FIGS. 1A-1C and 2A-2D schematically illustrate various aspects of example multiple-qubit gates (e.g., cells) in accordance with certain implementations described herein. The qubit gates are formed by interspersing electropotential wells both above and below parallel surface planes and using the electropotential wells to trap ions that are entangled with other trapped ions. Examples of ions compatible with certain implementations described herein include but are not limited to: $Ba^+$; $Be^+$; $Cd^+$; $Ca^+$; $Mg^+$; $Hg^+$; $Sr^+$; $Yb^+$. Vertical orientation is not required, so the terms "top" and "bottom" are not used.

FIG. 1A schematically illustrates a side-angle view and a top view of an example single-ion portion 10 of an example four-ion qubit gate 100 in accordance with certain implementations described herein. The single-ion portion 10 comprises a substantially planar substrate region 12, one or more electrical traces 14, an electrode region 16 comprising one or more electrodes (not shown), an electropotential well 17, and a single ion 18. In certain implementations, the substrate region 12 comprises a portion of an electrical insulator and/or semiconductor (e.g., silicon oxide; silicon) chip, and at least some of the electrical traces 14 are in electrical communication with the electrodes of the electrode region 16. At least some of the other electrical traces 14 can be in electrical communication with the electrodes of the electrode regions of portions of other neighboring qubits. For example, the electrical traces 14 and the electrodes within the electrode region 16 can comprise electrically conductive material (e.g., aluminum; copper; gold) deposited onto a surface of the substrate region 12, and can comprise at least one hermetic coating configured to hermetically seal the electrically conductive material from contaminants and/or corrosion. The electrodes of the electrode region 16 are configured to generate the electropotential well 17 which is configured to contain (e.g., suspend; trap) the single ion 18 at a position spaced away from the planar substrate region 12 (e.g., in a direction substantially perpendicular to the substrate region 12).

Figure 1B:
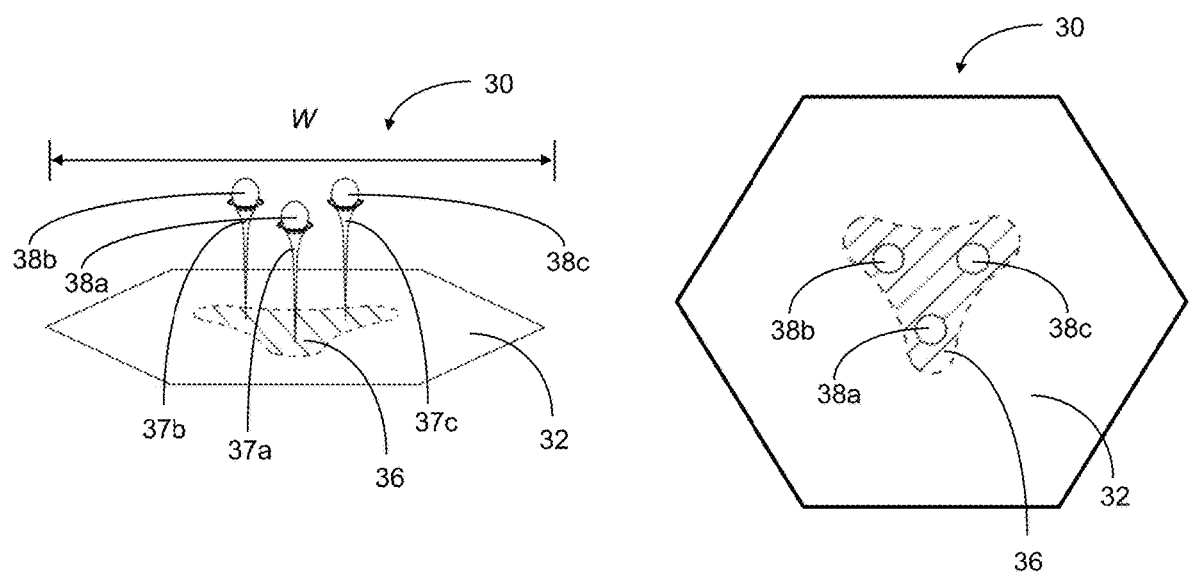

FIG. 1B schematically illustrates a side-angle view and a top view of an example three-ion portion 30 of the example four-ion qubit gate 100 in accordance with certain implementations described herein. The three-ion portion 30 comprises a substantially planar substrate region 32, one or more electrical traces (not shown), an electrode region 36 comprising multiple electrodes (not shown), three electropotential well 37a-c, and three ions 38a-c. In certain implementations, the substrate region 32 comprises a portion of an electrical insulator and/or semiconductor (e.g., silicon oxide; silicon) chip, and at least some of the electrical traces are in electrical communication with the electrodes of the electrode region 36. At least some of the other electrical traces can be in electrical communication with the electrodes of the electrode regions of other portions of neighboring qubits. For example, the electrical traces and the electrodes within the electrode region 36 can comprise electrically conductive material (e.g., aluminum; copper; gold) deposited onto a surface of the substrate region 32, and can comprise at least one hermetic coating configured to hermetically seal the electrically conductive material from contaminants and/or corrosion. In certain implementations, electrical traces 14 that are in electrical communication with electrodes within region 36 or other electrode regions can be in substrate layers (not shown) beneath the surface (e.g., sub-surface) and can run substantially consistently with other electrical traces 14 on the surface. The electrodes of the electrode region 36 are configured to generate the three electropotential wells 37a-c, each of which is configured to contain (e.g., suspend; trap) a corresponding one of the three ions 38a-c at a position spaced away from the planar substrate region 32 (e.g., in a direction substantially perpendicular to the substrate region 32). In certain implementations, the three ions 38a-c form an equilateral triangle (e.g., spaced from one another by a distance in a range of 30 microns to 40 microns), with the triangle substantially parallel to the substrate region 32. The three ions 38a-c of the triangle are an example of three qubits arranged in a substantially planar region and configured to interact with one another in accordance with certain implementations described herein.

In certain implementations, as shown in FIGS. 1A-1B, the substrate region 12 of the single-ion portion 10 and the substrate region 32 of the three-ion portion 30 (e.g., the portions of the respective chips that generally correspond to the four-ion qubit gate 100) have a substantially hexagonal shape, while in certain other implementations, the substrate regions 12, 32 have other shapes (e.g., rectangular; square; triangular; circular; oval; geometric; non-geometric; symmetric; non-symmetric).

The hashed regions of FIGS. 1A and 1B corresponding to the electrode regions 16, 36 (e.g., electrode patch zones) represent general "write" zones that are positioned and shaped to accommodate the multiple individual electrodes within each zone for generating the electropotential wells 17, 37a-c for confining the corresponding ions 18, 38a-c. The positioning and shaping of the various electrodes for the particular configurable gate implementation can be designed using algorithms (e.g., as provided by Schmied 2009). In certain implementations, the electrode regions 16, 36 are configured to trap, fully control, and perform gate operations using the corresponding ions 18, 38a-c. For example, the electrode region 36 of FIG. 1B can include eight or more electrodes per ion trap zone. In certain implementations, the electrodes and the electrode regions 16, 36 are based on previously developed electrodes and electrode regions for 2-D layouts for trapped ions (see, e.g., C. W. Hogle et al., "Characterization of Microfabricated Surface Ion Traps," Sandia National Lab., SAND2017-6113C (2017)).

Figure 1C:
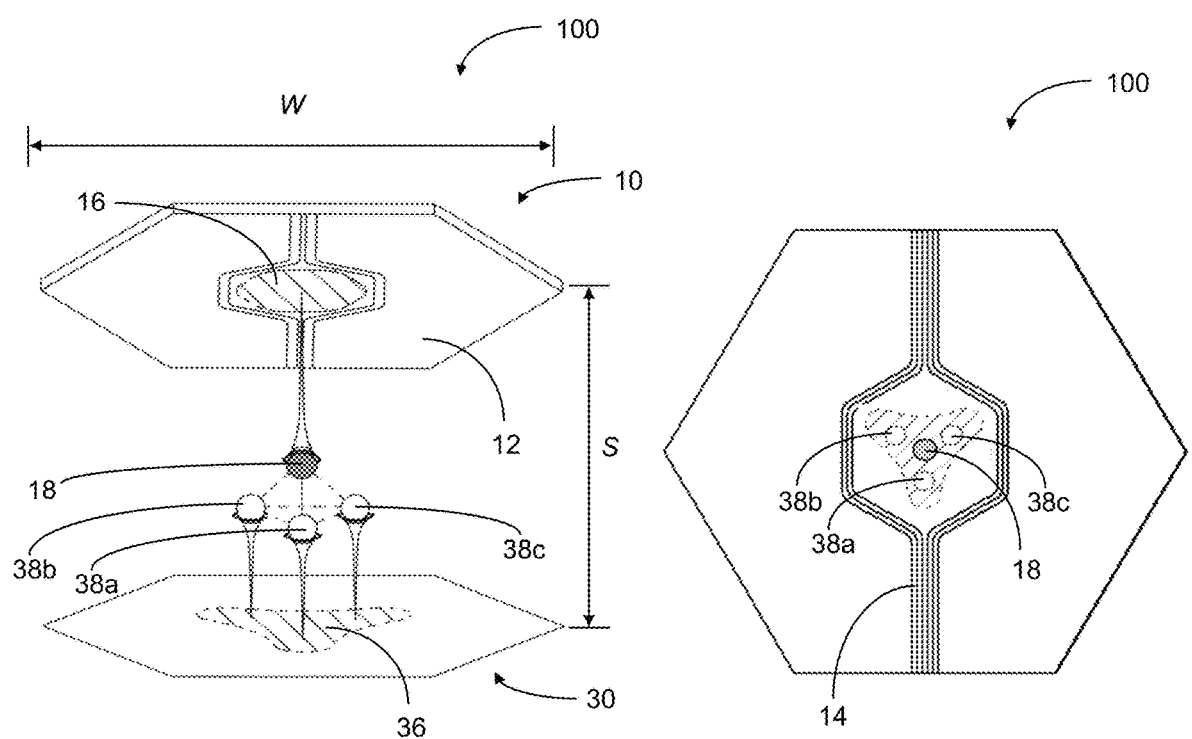

FIG. 1C schematically illustrates a side-angle view and a top view of the example four-ion qubit gate 100 comprising the single-ion portion 10 of FIG. 1A (e.g., as a "cap" of the four-ion qubit gate 100) and the three-ion portion 30 of FIG. 1B (e.g., as a "base" of the four-ion qubit gate 100), with the ions 18, 38a-c configured to be fully-connected to one another and/or to ions of neighboring qubit gates (e.g., simultaneously or in any subset combination), in accordance with certain implementations described herein. The example four-ion qubit gate 100 of FIG. 1A has a substantially hexagonal shape, while in certain other implementations, the qubit gate 100 has other shapes (e.g., rectangular; square; triangular; circular; oval; geometric; non-geometric; symmetric; non-symmetric). In certain implementations, the qubit gate 100 has a width W (e.g., in a range of less than or equal to 0.2 mm). While the right-side of FIG. 1C shows at least some of the electrical traces 14 on the surface of the portion 30, in certain implementations, at least some of the electrical traces 14 are in substrate layers (not shown) beneath the surface (e.g., sub-surface) and can run substantially consistently with other electrical traces 14 on the surface. In certain implementations, the substrate region 12 is substantially parallel to the substrate region 32 and the substrate region 12 is spaced from the substrate region 32 by a distance S (e.g., in a range less than or equal to 0.2 mm)

In certain implementations, the single ion 18 is spaced from each of the three ions 38a-c (e.g., by a distance in a range of 30 microns to 45 microns) and is positioned above the center of the triangle formed by the three ions 38a-c. Each of the ions 18, 38a-c is entangled with each of the other ions 18, 38a-c, as denoted by the dashed lines in FIG. 1C. In certain implementations, the example four-ion qubit gate 100 has a width W (e.g., in a range of less than or equal to 0.2 mm). The three ions 38a-c are an example of three qubits arranged in a first substantially planar region (e.g., the distances of the three ions 38a-c from the substrate region 32 can be within ±5 microns, within ±2 microns, and/or within ±1 micron of one another) and the single ion 18 is an example of a qubit arranged in a second substantially planar region substantially parallel to the first substantially planar region. The qubit of the second substantially planar region is configured to interact with the three qubits of the first substantially planar region which are configured to interact with one another, in accordance with certain implementations described herein.

In certain implementations, the example four-ion qubit gate 100 of FIG. 1C is used as a "native" $C^3$NOT gate (e.g., a triply-controlled NOT gate) and/or as "native" $C^3\varphi$ gate (e.g., a triply-controlled phase gate). The example four-ion qubit gate 100 of certain implementations can effect a $C^3$NOT/$C^3\varphi$ gate with significantly fewer gate operations than would be used by one- or two-qubit gates alone. In certain implementations, the net fidelity of the native $C^3$NOT/$C^3\varphi$ gate provided by the example four-ion qubit gate 100 is significantly greater than that of a $C^3$NOT/$C^3\varphi$ gate comprising many two-qubit gates that may have much higher individual gate fidelities, since the four-ion qubit gate 100 does not aggregate the errors of many successive operations to achieve its result. In certain such implementations, the $C^3$NOT/$C^3\varphi$ gate provided by the example four-ion qubit gate 100 uses a fraction of the steps of a $C^3$NOT/$C^3\varphi$ gate comprising many two-qubit gates, so the $C^3$NOT/$C^3\varphi$ gate provided by the example four-ion qubit gate 100 is faster and less error-prone (e.g., thereby utilizing significantly less error correction at the outset), as can be seen in a comparison of the probabilities of successful gate operation using both structures and fidelity estimates.

Figure 2A:
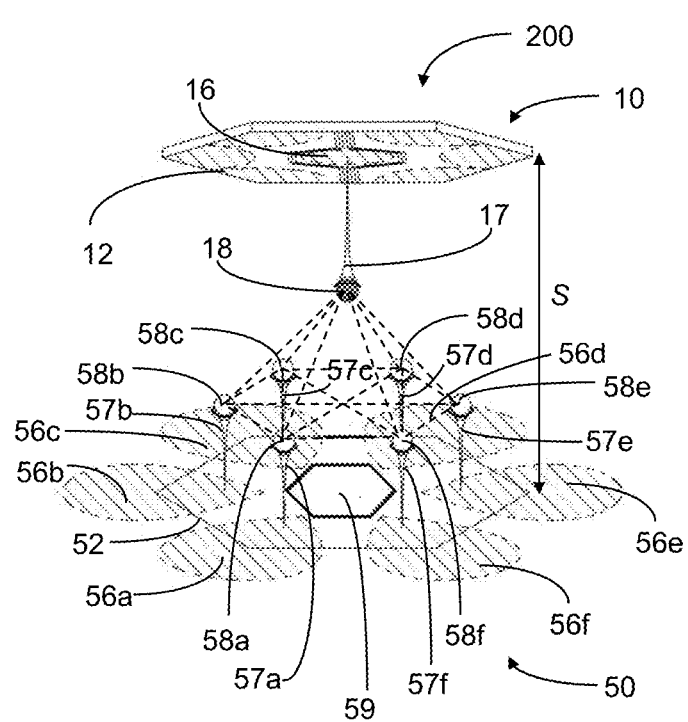

FIG. 2A schematically illustrates a side-angle view of an example seven-ion qubit gate 200 in accordance with certain implementations described herein. In certain implementations, the example seven-ion qubit gate 200 of FIG. 2A is configured to be used as a native $C^6$NOT/$C^6\varphi$ gate. The example seven-ion qubit gate 200 of FIG. 2A comprises the single-ion portion 10 of FIG. 1A (e.g., as a "cap" of the seven-ion qubit gate 200) and a six-ion portion 50 (e.g., as a "base" of the seven-ion qubit gate 200). The six-ion portion 50 comprises a planar substrate region 52, one or more electrical traces (not shown), six electrode regions 56a-f, six electropotential wells 57a-f, and six ions 58a-f. The electrodes of the electrode regions 56a-f are configured to generate the six electropotential wells 57a-f, each of which is configured to contain (e.g., suspend; trap) a corresponding one of the six ions 58a-f at a position spaced away from the planar substrate region 52 (e.g., in a direction substantially perpendicular to the substrate region 52). As schematically illustrated by FIG. 2A, the example seven-ion qubit gate 200 can comprise an additional electrode 59 (e.g., a cover electrode) (see, e.g., C. E. Pearson et al., Phys. Rev. A Vol. 73, 032307 (2006)) positioned below the single ion 18 of the single-ion portion 10 and configured to aid tuning of the distance of the single ion 18 relative to the six-ion portion 50. In certain implementations, the six ions 58a-f form an equilateral hexagon (e.g., spaced from one another by a distance in a range of 35 microns to 70 microns), with the hexagon substantially parallel to the substrate region 52. The spacing of the hexagons from one another can be set based on various parameters, including but not limited to: multiple tuning parameters, ion species, crystal lattice angles formed. In certain implementations, the distance of each qubit in the hexagon from the nearest substrate can have variability (e.g., at a nominal distance of 40 microns±5 microns), as a result of 3-D angles in the crystal lattice. The seven ions 18, 58a-f are configured to be fully connected to one another and/or to ions of neighboring qubit gates (e.g., simultaneously, or in any subset combination), as schematically illustrated by the dotted lines which denote entanglements among the seven ions 18, 58a-f. As schematically illustrated in FIG. 2A, in certain implementations, portions of the electrode regions 56a-f of the six-ion portion 50 extend onto the substrate regions of the bases of neighboring qubits and portions of the electrode regions of neighboring portions extend onto the substrate region 12 of the single-ion portion 10. The six ions 58a-f are an example of six qubits arranged substantially in a first substantially planar region (e.g., the distances of the six ions 58a-f from the substrate portion 52 can be within ±5 microns, within ±2 microns, and/or within ±1 micron of one another) and the single ion 18 is an example of a qubit arranged in a second substantially planar region substantially parallel to the first substantially planar region. The qubit of the second substantially planar region is configured to interact with the six qubits of the first substantially planar region which are configured to interact with one another, in accordance with certain implementations described herein.

In certain implementations, the single ion 18 is contained (e.g., suspended; trapped) in a first electropotential well 17, the single ion 18 at a first distance (e.g., 40 microns) from the electrode region 16. In certain other implementations, the single ion 18 is contained in a second electropotential well, the single ion 18 at a second distance from the substrate region 52, the second distance approximately twice the first distance (e.g., 80 microns). For example, the second electropotential well can be formed naturally (see, e.g., M. Mielenz et al., "Arrays of individually controlled ions suitable for two-dimensional quantum simulations," Nature Communications, 7:11839 (2016)). In certain implementations, the first electropotential well 17 and the second electropotential well coincide or overlap with one another such that the single ion 18 is contained in both the first and second electropotential wells concurrently, while in certain other implementations, the first and second electropotential wells are separate from one another.

Figure 2B:
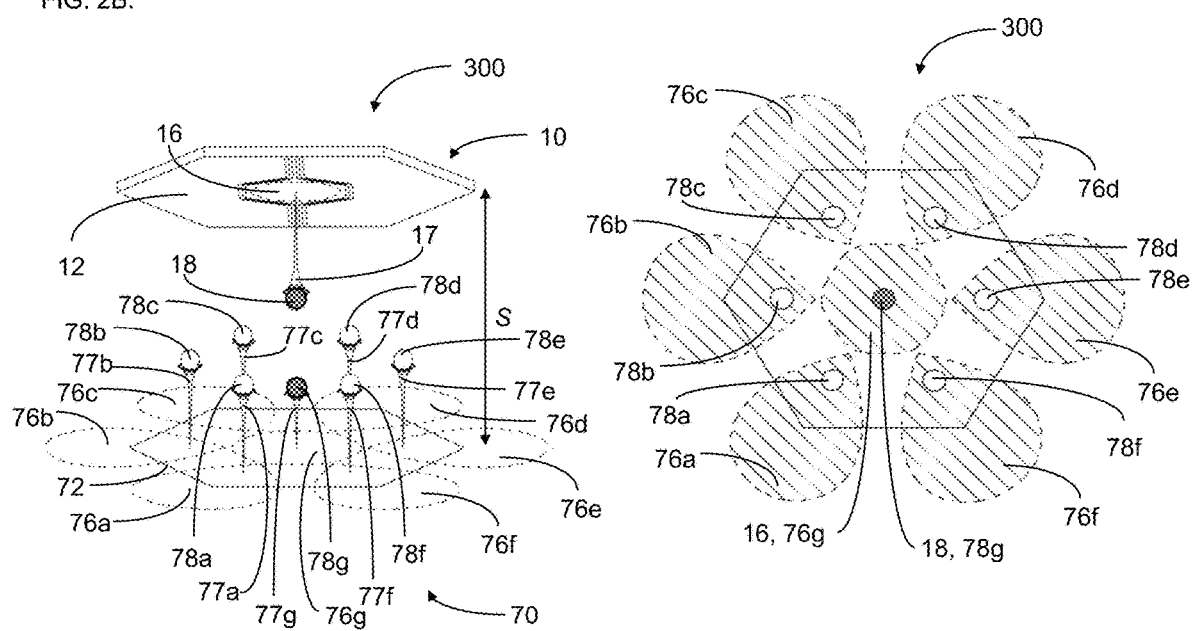

FIG. 2B schematically illustrates a side-angle view and a top view of an example eight-ion qubit gate 300 in accordance with certain implementations described herein. In certain implementations, the example eight-ion qubit gate 300 of FIG. 2B is configured to be used up to a $C^7NOT/C^7\varphi$ gate. The example eight-ion qubit gate 300 of FIG. 2B comprises the single-ion portion 10 of FIG. 1A (e.g., as a "cap" of the eight-ion qubit gate 300) and a seven-ion portion 70 (e.g., as a "base" of the eight-ion qubit gate 300). The seven-ion portion 70 comprises a planar substrate region 72, one or more electrical traces (not shown), seven electrode regions 76a-g, seven electropotential wells 77a-g, and seven ions 78a-g. The electrodes of the electrode regions 76a-g are configured to generate the seven electropotential wells 77a-g, each of which is configured to contain (e.g., suspend; trap) a corresponding one of the seven ions 78a-g at a position spaced away from the planar substrate region 72 (e.g., in a direction substantially perpendicular to the substrate region 72). The example eight-ion qubit 300 of FIG. 2B is similar to the seven-ion qubit gate 200 of FIG. 2A, with the addition of the eighth electrode region 76g, eighth electropotential well 77g, and eighth ion 78g (e.g., positioned in a range of 30 to 60 microns above the electrode region 76g). The distance of the eighth ion 78g from the substrate region 72 can be based on various factors, including but not limited to whether the seven-ion portion 70 is combined with a single-ion portion 10, a three-ion portion 30, or another multiple-ion portion as described herein. The eight ions 18, 78a-g are configured to be fully connected to one another and/or to ions of neighboring qubit gates (e.g., simultaneously, or in any subset combination) (dotted lines denoting entanglements among the eight ions 18, 78a-g are omitted from FIG. 2B for the sake of clarity). The six ions 78a-f are an example of six qubits arranged substantially in a first substantially planar region (e.g., the distances of the six ions 78a-f from the substrate portion 72 can be within ±5 microns, within ±2 microns, and/or within ±1 micron of one another), the seventh ion 78g is an example of a qubit arranged in a second substantially planar region substantially parallel to the first substantially planar region, and the single ion 18 is an example of a qubit arranged in a third substantially planar region substantially parallel to the first substantially planar region. The qubit of the second substantially planar region and the qubit of the third substantially planar region are configured to interact with one another and with the six qubits of the first substantially planar region which are configured to interact with one another, in accordance with certain implementations described herein.

With regard to the example seven-ion qubit gate 200 of FIG. 2A and the example eight-ion qubit gate 300 of FIG. 2B, in certain implementations, each of the qubit gates 200, 300 has a substantially hexagonal shape, while in certain other implementations, the qubit gates 200, 300 have other shapes (e.g., rectangular; square; triangular; circular; oval; geometric; non-geometric; symmetric; non-symmetric). In certain implementations, the substrate region 52, 72 comprises a portion of an electrical insulator and/or semiconductor (e.g., silicon oxide; silicon) chip, at least some of the electrical traces are in electrical communication with the electrodes of the electrode regions 56, 76 and other electrical traces are in electrical communication with the electrode regions of other bases. In certain implementations, each of the electrode regions 56, 76 comprises one or more electrodes in electrical communication with at least some of the electrical traces, and the electrical traces and the electrodes within the electrode regions 56, 76 comprise electrically conductive material (e.g., aluminum; copper; gold) deposited onto a surface of the substrate region 52, 72, and can comprise at least one hermetic coating configured to hermetically seal the electrically conductive material from contaminants and/or corrosion. The electrodes of the electrode regions 56, 76 of certain implementations are configured to at least partially extend into neighboring regions (e.g., regions of neighboring qubits) and to provide space for the electrical traces to run to the electrode region of the qubit gate 200, 300 and/or to the neighboring qubits. In certain implementations, the seven-ion qubit gate 200 and/or the eight-ion qubit gate 300 has a width W (e.g., in a range of less than or equal to 0.2 mm), the substrate region 12 is substantially parallel to the substrate region 52, 72, and the substrate region 12 is spaced from the substrate region 52, 72 by a distance S (e.g., in a range less than or equal to 0.2 mm).

Figure 2C:
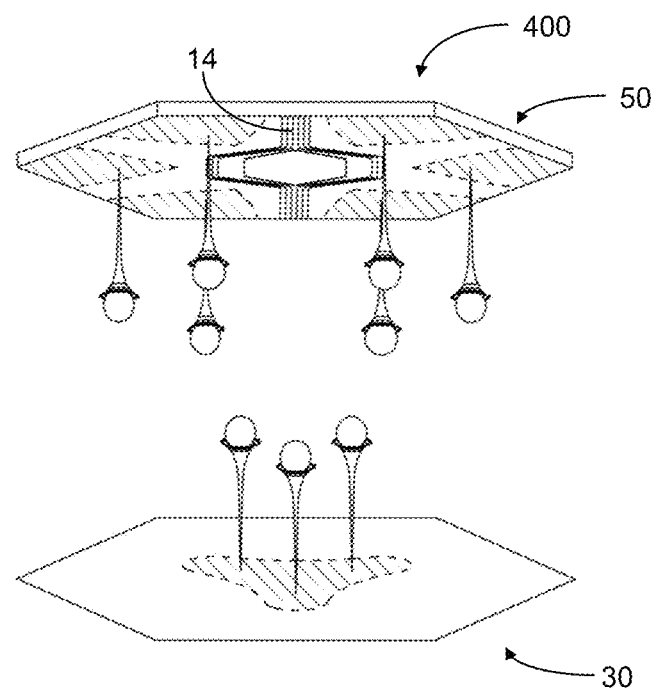

FIG. 2C schematically illustrates a side-angle view of an example nine-ion qubit gate 400 in accordance with certain implementations described herein. In certain implementations, the nine-ion qubit gate 400 can aid cross-chip connectivity (e.g., in a QFPGA architecture or in a QASIC architecture). In certain implementations, the example nine-ion qubit gate 400 of FIG. 2C can also be configured to be used in multiply-controlled gate operations or to employ combinations of redundant control and/or target qubits to facilitate self-error-correcting gates at desired nodes. The example nine-ion qubit gate 400 of FIG. 2C comprises the six-ion portion 50 of FIG. 2A (e.g., as a "cap" of the nine-ion qubit gate 400) and the three-ion portion 30 (e.g., as a "base" of the nine-ion qubit gate 400). The nine ions 38a-c, 58a-f are configured to be fully connected to one another and/or to ions of neighboring qubit gates (e.g., simultaneously, or in any subset combination) (dotted lines denoting entanglements among the nine ions 38a-c, 58a-f are omitted from FIG. 2C for the sake of clarity). The six ions 58a-f are an example of six qubits arranged substantially in a first substantially planar region (e.g., the distances of the six ions 58a-f from the substrate portion 52 can be within ±5 microns, within ±2 microns, and/or within ±1 micron of one another) and the three ions 38a-c are an example of three qubits arranged in a second substantially planar region (e.g., the distances of the three ions 38a-c from the substrate portion 32 can be within ±5 microns, within ±2 microns, and/or within ±1 micron of one another) substantially parallel to the first substantially planar region. The six qubits 58a-f of the first substantially planar region are configured to interact with one another, and the three qubits 38a-c of the second substantially planar region are configured to interact with one another and with qubits of the first substantially planar region in accordance with certain implementations described herein. In certain implementations, the three ions 38a-c and/or the six ions 58a-f are further configured to interact with ions of other qubit gates neighboring the nine-ion qubit gate 400 (e.g., intercell interactions).

Figure 2D:
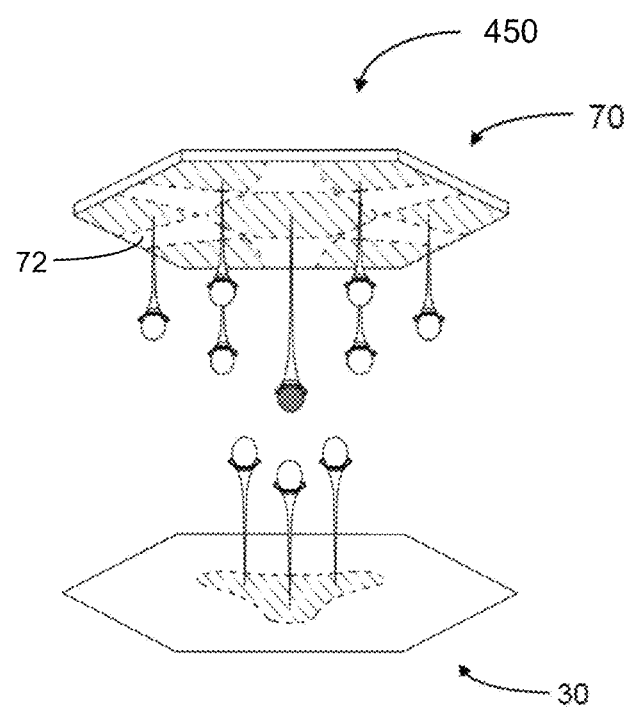

FIG. 2D schematically illustrates a side-angle view of an example ten-ion qubit gate 450 in accordance with certain implementations described herein. In certain implementations, the ten-ion qubit gate 450 can aid cross-chip connectivity (e.g., in a QFPGA architecture or in a QASIC architecture). In certain implementations, the example ten-ion qubit gate 450 of FIG. 2D can also be configured to be used in multiply-controlled gate operations (e.g., up to a $C^9NOT/C^9\varphi$ gate) or to employ combinations of redundant control and/or target qubits to facilitate self-error-correcting gates at desired nodes. The example ten-ion qubit gate 450 of FIG. 2D comprises the seven-ion portion 70 of FIG. 2B (e.g., as a "cap" of the ten-ion qubit gate 450) and the three-ion portion 30 (e.g., as a "base" of the ten-ion qubit gate 450). The ten ions 38a-c, 78a-g are configured to be fully connected to one another and/or to ions of neighboring qubit gates (e.g., simultaneously, or in any subset combination) (dotted lines denoting entanglements among the nine ions 38a-c, 78a-g are omitted from FIG. 2D for the sake of clarity). The six ions 78a-f are an example of six qubits arranged substantially in a first substantially planar region (e.g., the distances of the six ions 78a-f from the substrate portion 72 can be within ±5 microns, within ±2 microns, and/or within ±1 micron of one another), the seventh ion 78g is an example of a qubit arranged in a second substantially planar region substantially parallel to the first substantially planar region, and the three ions 38a-c are an example of three qubits arranged in a third substantially planar region (e.g., the distances of the three ions 38a-c from the substrate portion 32 can be within ±5 microns, within ±2 microns, and/or within ±1 micron of one another) substantially parallel to the first substantially planar region. The six qubits 78a-f of the first substantially planar region are configured to interact with one another, the three qubits 38a-c of the third substantially planar region are configured to interact with one another, as well as with qubits of the first substantially planar region, and the single qubit of the second substantially planar region is configured to interact with qubits of the first substantially planar region and qubits of the second substantially planar region, in accordance with certain implementations described herein. In certain implementations, the three ions 38a-c and/or the seven ions 78a-g are further configured to interact with ions of other qubit gates neighboring the ten-ion qubit gate 450 (e.g., intercell interactions).

Figure 2E:
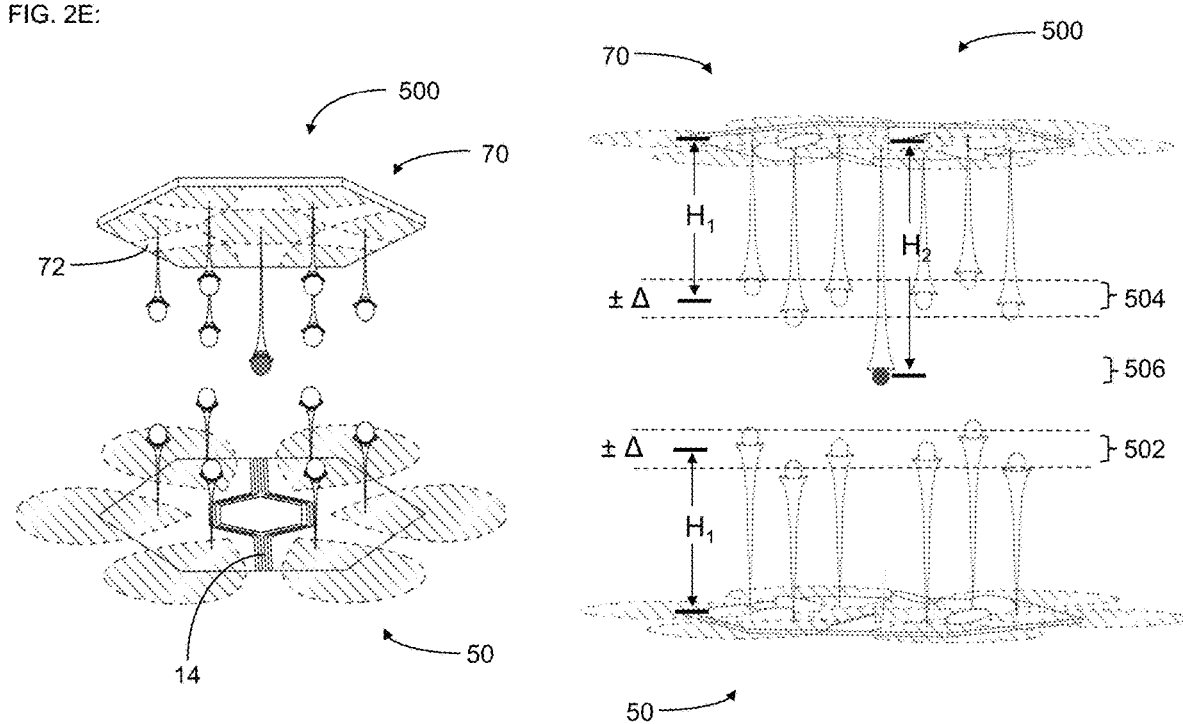

FIG. 2E schematically illustrates two side-angle views of an example thirteen-ion qubit gate 500 (e.g., a "pyrochlore" cell) in accordance with certain implementations described herein. In certain implementations, the example thirteen-ion qubit gate 500 of FIG. 2E is configured to be used up to a $C^{12}NOT/C^{12}\varphi$ gate. The example thirteen-ion qubit gate 500 of FIG. 2E comprises the seven-ion portion 70 of FIG. 2B (e.g., as a "cap" of the thirteen-ion qubit gate 500), with an increase in length of the electropotential well 77g, and concomitant distance of the ion 78g from the electrode region 76g, along with the six-ion portion 50 (e.g., as a "base" of the thirteen-ion gate qubit 500). The thirteen ions 58a-f, 78a-g are configured to be fully connected to one another and/or to ions of neighboring qubit gates (e.g., simultaneously, or in any subset combination) (dotted lines denoting entanglements among the thirteen ions 58a-f, 78a-g are omitted from FIG. 2E for the sake of clarity). The six ions 58a-f are an example of six qubits arranged substantially in a first substantially planar region 502 (e.g., the distances of the six ions 58a-f from the substrate portion 52 can be within ±5 microns, within ±2 microns, and/or within ±1 micron of one another; at a distance $H_1$ of about 40 microns from the substrate portion 52), the six ions 78a-f are an example of six qubits arranged substantially in a second substantially planar region 504 (e.g., the distances of the six ions 78a-f from the substrate portion 72 can be within ±5 microns, within ±2 microns, and/or within ±1 micron of one another; at a distance $H_1$ of about 40 microns from the substrate portion 72) substantially parallel to the first substantially planar region 502, and the single ion 18 is an example of a qubit arranged in a third substantially planar region 506 substantially parallel to the first substantially planar region 502 (e.g., at a distance $H_2$ in a range of 50 microns to 60 microns from the substrate portion 72). The six qubits of the first substantially planar region 502 are configured to interact with one another, the six qubits of the second substantially planar region 504 are configured to interact with one another and with the six qubits of the first substantially planar region 502, and the qubit of the third substantially planar region 506 is configured to interact with qubits of the first substantially planar region 502 and with qubits of the second substantially planar region 504, in accordance with certain implementations described herein. In certain implementations, the six ions 58a-f and/or the seven ions 78a-g are further configured to interact with ions of other qubit gates neighboring the thirteen-ion qubit gate 500 (e.g., intercell interactions).

Figure 2F:
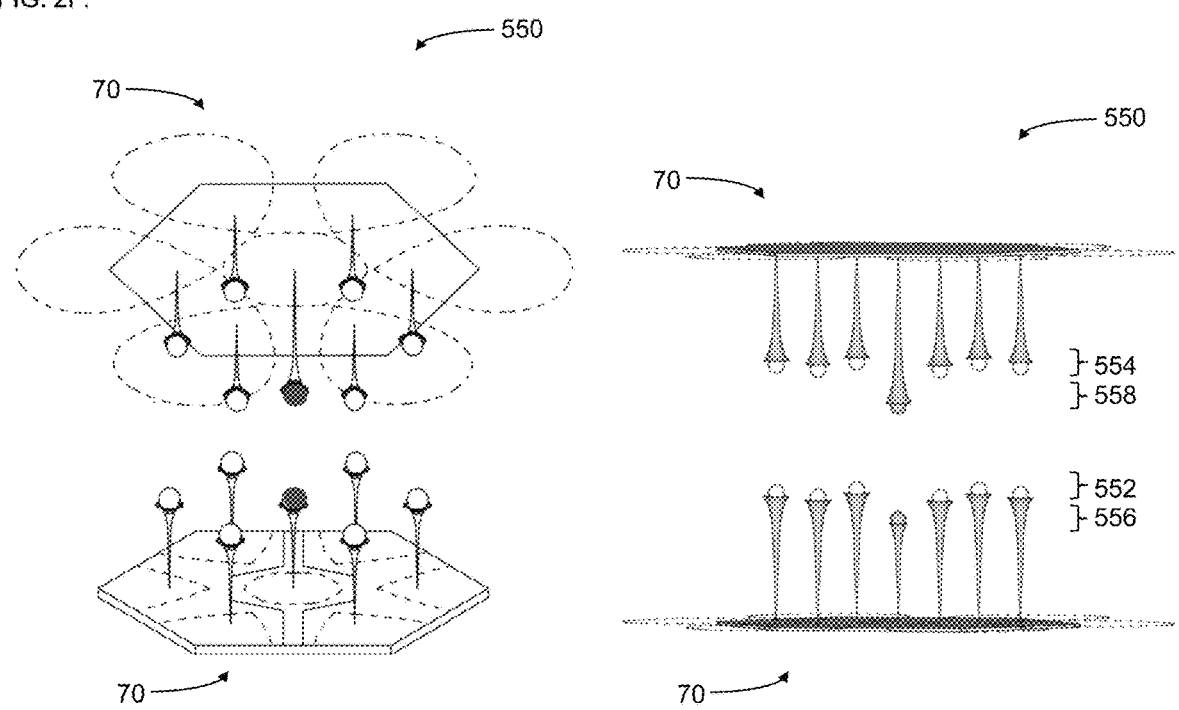

FIG. 2F schematically illustrates two side-angle views of an example fourteen-ion qubit gate 550 in accordance with certain implementations described herein. In certain implementations, the example fourteen-ion qubit gate 550 of FIG.

2F is configured to be used up to a $C^{13}NOT/C^{13}\varphi$ gate. The example fourteen-ion qubit gate 550 of FIG. 2F comprises a first seven-ion portion 70 (see, e.g., FIG. 2B) (e.g., as a "cap" of the fourteen-ion qubit gate 550), with the ion 78g and the electropotential well 77g of the first seven-ion portion 70 a longer distance from the substrate portion 72 than are the ion 78g and the electropotential well 77g of FIG. 2B. The example fourteen-ion qubit gate 550 of FIG. 2F further comprises a second seven-ion portion 70 (see, e.g., FIG. 2B) (e.g., as a "base" of the fourteen-ion gate qubit gate 550), with the ion 78g and the electropotential well 77g of the second seven-ion portion 70 a shorter distance from the substrate portion 72 than are the ion 78g and the electropotential well 77g of FIG. 2B. The first set of ions 78a-g of the first seven-ion portion 70 and the second set of ions 78a-g of the second seven-ion portion 70 are configured to be fully connected to one another and/or to ions of neighboring qubit gates (e.g., simultaneously, or in any subset combination) (dotted lines denoting entanglements among the first set of ions 78a-g and the second set of ions 78a-g are omitted from FIG. 2F for the sake of clarity).

The six ions 78a-f in the "base" are an example of six qubits arranged substantially in a first substantially planar region 552 (e.g., the distances of the six ions 78a-f from the substrate portion 72 can be within ±5 microns, within ±2 microns, and/or within ±1 micron of one another; at a distance $H_1$ of about 40 microns from the substrate portion 72), the six ions 78a-f in the "cap" are an example of six qubits arranged substantially in a second substantially planar region 554 (e.g., the distances of the six ions 78a-f from the substrate portion 72 can be within ±5 microns, within ±2 microns, and/or within ±1 micron of one another; at a distance $H_1$ of about 40 microns from the substrate portion 72) substantially parallel to the first substantially planar region 552, one ion 78g above the base is an example of a qubit arranged in a third substantially planar region 556 substantially parallel to the first substantially planar region 552 (e.g., at a distance $H_2$ in a range of 30 microns to 40 microns from the substrate portion 72), and one ion 78g below the cap is an example of a qubit arranged in a fourth substantially planar region 558 substantially parallel to the second substantially planar region 554 (e.g., at a distance $H_3$ in a range of 50 microns to 60 microns from the substrate portion 72). The qubits of the first substantially planar region 552 are configured to interact with one another, the qubits of the second substantially planar region 554 are configured to interact with one another and with qubits of the first substantially planar region 552. The qubit of the third substantially planar region 556 is configured to interact with the qubits of the first substantially planar region 552 and with the qubits of the second substantially planar region 554. The qubit of the fourth substantially planar region 558 is configured to interact with qubits of the first substantially planar region 552, with qubits of the second substantially planar region 554, and with the qubit of the third substantially planar region 556 in accordance with certain implementations described herein. In certain implementations, the first set of ions 78a-g and/or the second set of ions 78a-g are further configured to interact with ions of other qubit gates neighboring the fourteen-ion qubit gate 550 (e.g., intercell interactions).

The examples provided correspond to configurations configured to be employed in the pluralities of multi-qubit gate array implementations that follow (e.g., as QFPGA or QASIC implementations) for ease of discussion. Other cell combinations of the "cap" and "base" are also compatible with certain implementations described herein. For example, in a QASIC implementation, it can be advantageous to combine the seven-ion portion 70 of FIG. 2B, modified by an increase or decrease in length of the electropotential well 77g, and concomitant distance of the ion 78g from the electrode region 76g as described above, to create a fourteen-ion qubit gate that can be used up to a $C^{13}NOT/C^{13}\varphi$ gate as schematically illustrated in FIG. 2F. In addition, these and other numbers of qubits (e.g., 1, 2, 3, 4, 5, 6, 7, 8, 9, 10, or more qubits) per first portion 810 and/or per second portion 820 are compatible with certain implementations described herein.

Certain implementations described herein provide a quantum computing (QC) system 1000 comprising a substantially planar first substrate 600 and a substantially planar second substrate 700, the first substrate 600 and the second substrate 700 substantially parallel to one another. The quantum computing system 1000 further comprises a multiple-qubit gate array 800 comprising a plurality of multiple-qubit gates 802 positioned in a region between the first substrate 600 and the second substrate 700. Each multiple-qubit gate 802 of the array 800 comprises a first (e.g., base) portion 810 at (e.g., above; below; on) a surface of the first substrate 600 and a second (e.g., cap) portion 820 at (e.g., above; below; on) a surface of the second substrate 700 and the qubits interact with one another between the surfaces of the first and second substrates 600, 700. The first portion 810 of each multiple-qubit gate 802 of the array 800 is selected from the group consisting of: a single-qubit portion 10, a three-qubit portion 30, a six-qubit portion 50, and a seven-qubit portion 70. The first portions 810 are arranged along the surface of the first substrate 600 (e.g., the substrate regions 12, 32, 52, 72 of the single-qubit portions 10, three-qubit portions 30, six-qubit portions 50, and seven-qubit portions 70 are regions of the first substrate 600). The second portion 820 of each multiple-qubit gate 802 of the array 800 is selected from the group consisting of: a single-qubit portion 10, a three-qubit portion 30, a six-qubit portion 50, and a seven-qubit portion 70. The second portions 820 are arranged along the surface of the second substrate 700 (e.g., the substrate regions 12, 32, 52, 72 of the single-qubit portions 10, three-qubit portions 30, six-qubit portions 50, and seven-qubit portions 70 are regions of the second substrate 700). For each multiple-qubit gate 802, each qubit of the first portion 810 and of the second portion 820 of the multiple-qubit gate 802 is configured to be quantum-mechanically entangled with each of the other qubits of the first portion 810 and the second portion 820 of the multiple-qubit gate 802.

Figure 3A:
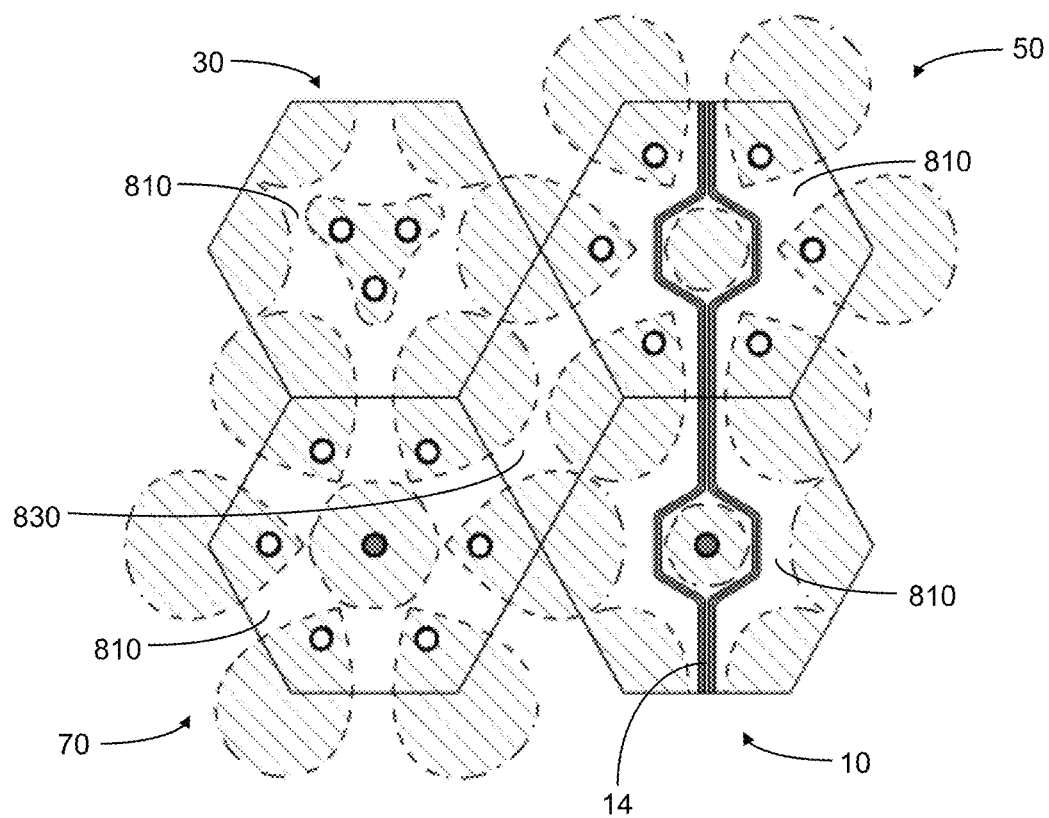
FIG. 3A schematically illustrates a top view of four example first portions (e.g., bases) of an example array comprising four multiple-ion qubit gates (e.g., cells) in accordance with certain implementations described herein.

FIG. 3A schematically illustrates a top view of four example first portions 810 (e.g., bases) of an example array 800 comprising four multiple-ion qubit gates (e.g., cells) 802 in accordance with certain implementations described herein. The four first portions 810 of FIG. 3A comprise a one-ion portion 10, a three-ion portion 30, a six-ion portion 50, and a seven-ion portion 70. These four first portions 810 are tiled together with their respective substrate regions 12, 32, 52, 72 each part of a common first substrate 600 (e.g., the substrate regions 12, 32, 52, 72 are coplanar with one another at a surface of the first substrate 600). The tiling includes a rhomboid region 830 bounded by the four first portions 810. As shown in FIG. 3A, at least some of the electrode regions of the six-ion portion 50 and the seven-ion portion 70 (e.g., electrode regions 56a-f, 76a-f) extend to neighboring first portions 810 and/or the rhomboid region 830. In certain implementations, the first portions 810 in adjacent rows are configured to facilitate tiling the first portions 810 close together (e.g., without the electrode regions overlapping one another). While FIG. 3A shows the first portions 810 in a substantially rectangular pattern, the first portions 810 of other implementations can be in a substantially hexagonal pattern or a substantially diagonal pattern. Furthermore, while the first portions 810 of FIG. 3A are schematically illustrated as a 2×2 array, other tiling combinations of two, three, or more portions in arrays are also compatible with certain implementations described herein. For example, the first portions 810 can be tiled in arrays that are linear (e.g., 1×2, 1×3, or more), square or rectangular (e.g., 2×3, 3×3, 2×4, 3×4, 4×4, 2×5, etc.), and other geometries that can be regular or irregular (e.g., similar to domino tiling) and/or symmetric or non-symmetric.

Figure 3B:
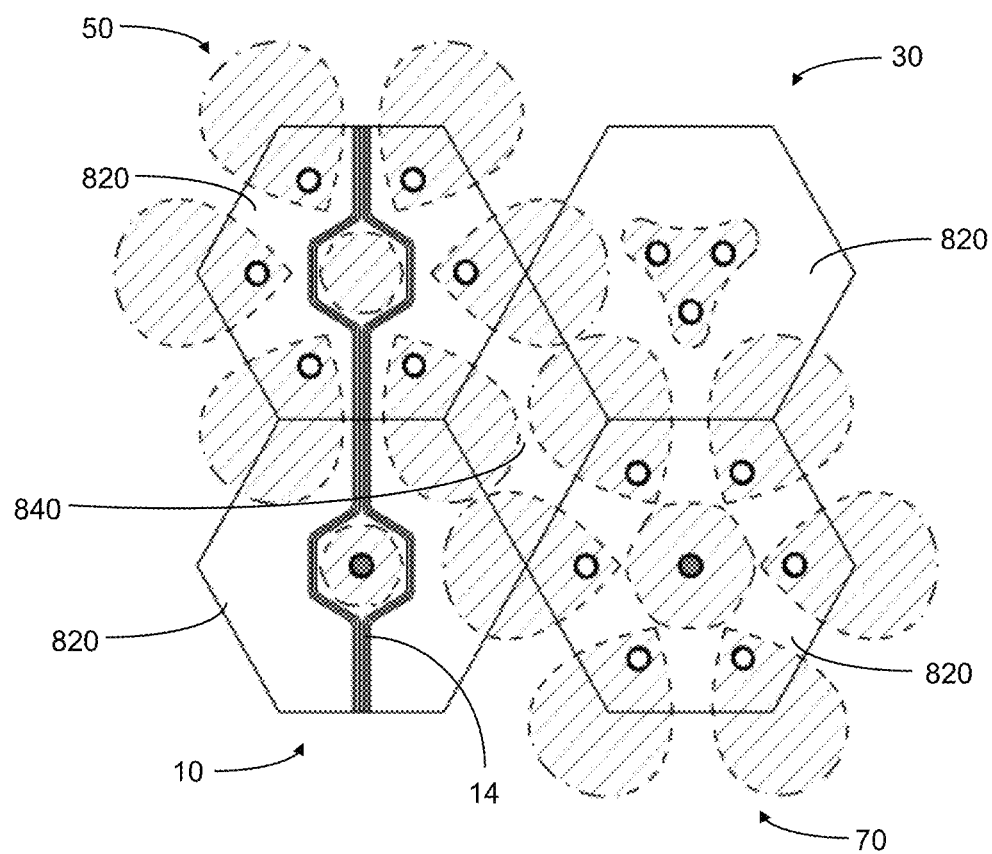
FIG. 3B schematically illustrates a top view of four example second portions (e.g., caps) of the example array and four multiple-ion qubit gates in accordance with certain implementations described herein.

FIG. 3B schematically illustrates a top view of four example second portions 820 (e.g., caps) of the example array 800 and four multiple-ion qubit gates 802 in accordance with certain implementations described herein. The four second portions 820 of FIG. 3B comprise a one-ion portion 10, a three-ion portion 30, a six-ion portion 50, and a seven-ion portion 70. These four second portions 820 are tiled together with their respective substrate regions 12, 32, 52, 72 each part of a common second substrate 700 (e.g., the substrate regions 12, 32, 52, 72 are coplanar with one another at a surface of the second substrate 700). The tiling includes a rhomboid region 840 bounded by the four first portions 820. As shown in FIG. 3B, at least some of the electrode regions of the six-ion portion 50 and the seven-ion portion 70 (e.g., electrode regions 56a-f, 76a-f) extend to neighboring second portions 820 and/or the rhomboid region 840. In certain implementations, the second portions 820 in adjacent rows are configured to facilitate tiling the second portions 820 close together (e.g., without the electrode regions overlapping one another). While FIG. 3B shows the second portions 820 in a substantially rectangular pattern, the second portions 820 of other implementations can be in a substantially hexagonal pattern or a substantially diagonal pattern. Furthermore, while the second portions 820 of FIG. 3B are schematically illustrated as a 2×2 array, other tiling combinations of two, three, or more portions in arrays, and which coincide with the tiling of the first portions 810, are also compatible with certain implementations described herein. For example, the second portions 820 can be tiled in arrays that are linear (e.g., 1×2, 1×3, or more), square or rectangular (e.g., 2×3, 3×3, 2×4, 3×4, 4×4, 2×5, etc.), and other geometries that can be regular or irregular (e.g., similar to domino tiling) and/or symmetric or non-symmetric.

Figure 3C:
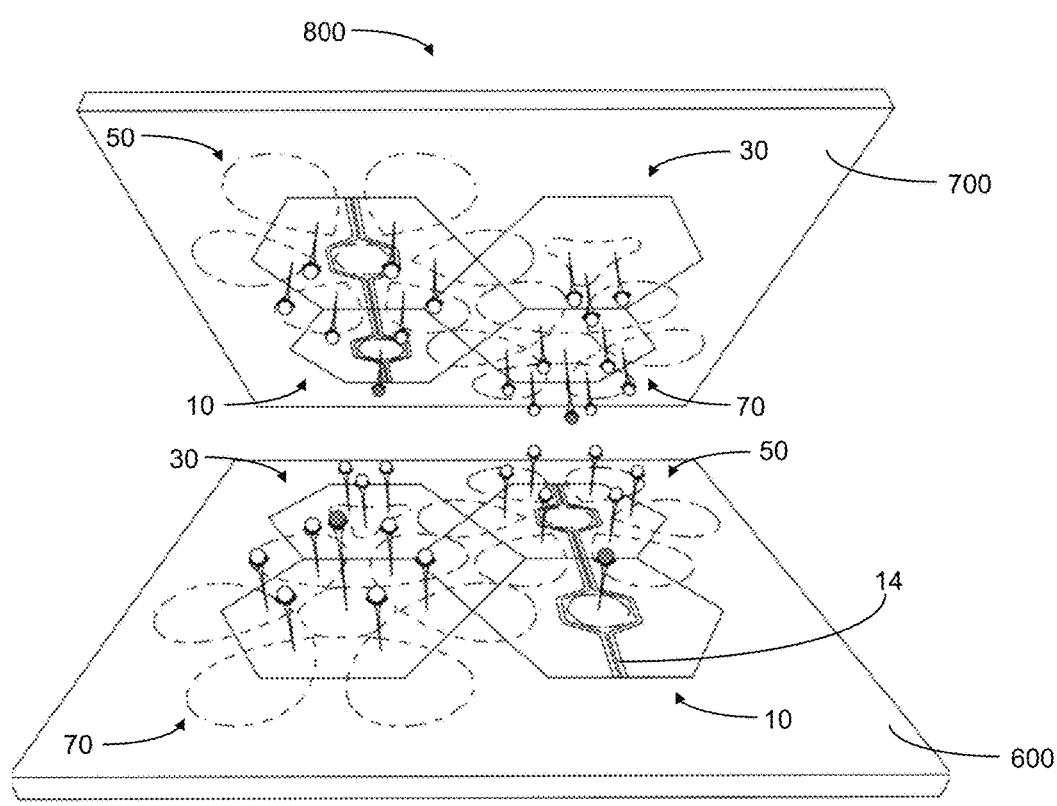
FIGS. 3C-3D schematically illustrate an exploded view and a top view, respectively, of the example array and four multiple-ion qubit gates of FIGS. 3A-3B in accordance with certain implementations described herein.
Figure 3D:
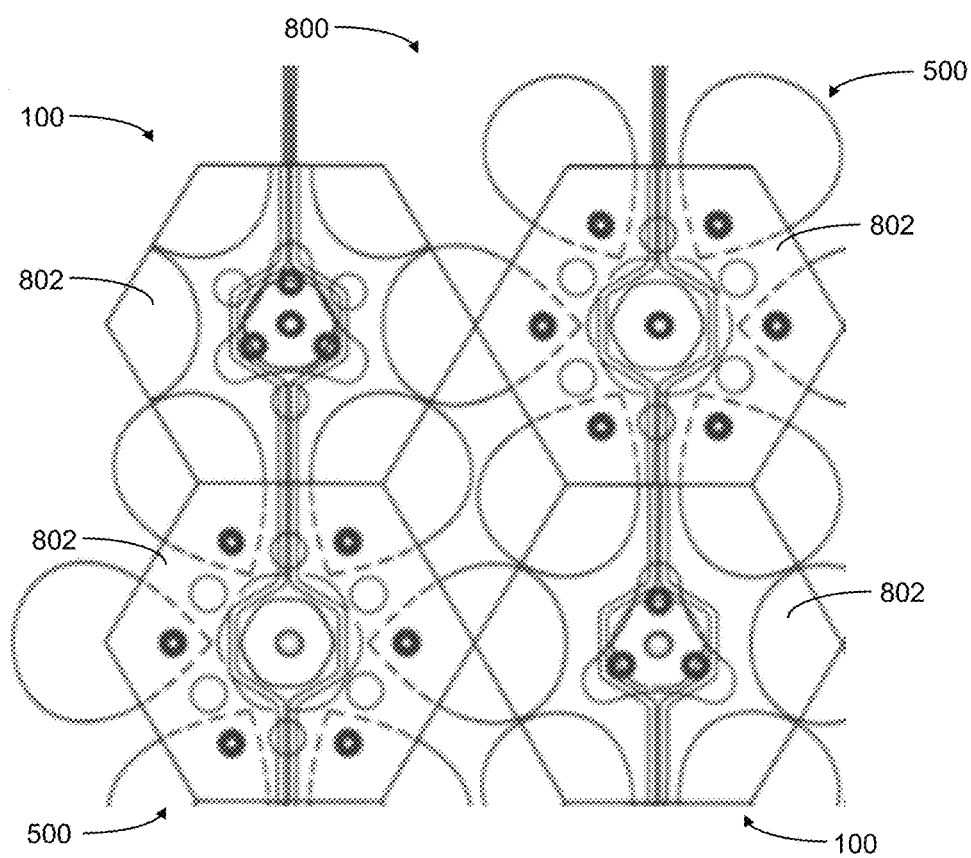

FIGS. 3C-3D schematically illustrates an exploded view and a top overlay view, respectively, of the example array 800 and four multiple-ion qubit gates 802 of FIGS. 3A-3B in accordance with certain implementations described herein. The four multiple-ion qubit gates 802 comprise two four-ion qubit gates 100 and two thirteen-ion qubit gates 500 between the first substrate 600 and the second substrate 700. One of the four-ion qubit gates 100 comprises a three-ion base portion 30 and a one-ion cap portion 10, another of the four-ion qubit gates 100 comprises a one-ion base portion 10 and a three-ion cap portion 30, one of the thirteen-ion qubit gates 500 comprises a seven-ion base portion 70 and a six-ion cap portion 50, and another of the thirteen-ion qubit gates 500 comprises a six-ion base portion 50 and a seven-ion cap portion 70. As described herein with regard to FIGS. 3A and 3B, other tiling combinations of the bases and caps into 3-D gate cell layouts can be used.

Figure 3E:
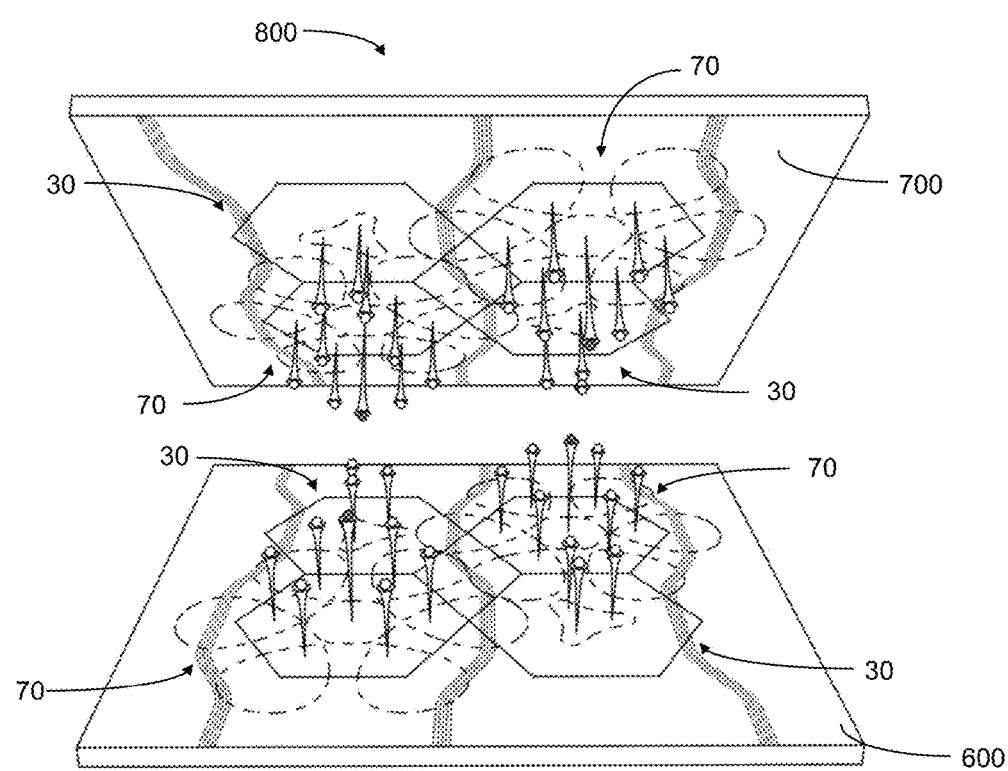
FIG. 3E schematically illustrate an exploded view of another example array with four ten-ion qubit gates in accordance with certain implementations described herein.

FIG. 3E schematically illustrate an exploded view of another example array 800 with four multiple-ion qubit gates 802 in accordance with certain implementations described herein. The four multiple-ion qubit gates 802 comprise four ten-ion qubit gates 450 between the first substrate 600 and the second substrate 700. Two of the ten-ion qubit gates 450 each comprises a three-ion base portion 30 and a seven-ion cap portion 70, and the other two ten-ion qubit gates 450 each comprises a seven-ion base portion 70 and a three-ion cap portion 30. In the 2×2 array of the substrate 600, the three-ion base portions 30 and seven-ion base portions 70 alternate with one another and in the 2×2 array of the substrate 700, the seven-ion cap portions 70 and three-ion cap portions 30 alternate with one another. The electrical trace line layouts shown in FIG. 3E are different from those of FIGS. 3C-3D.

Figure 4A:
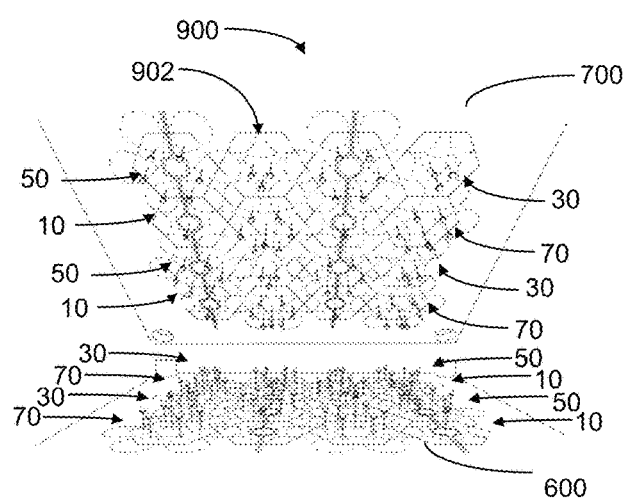
FIGS. 4A-4B schematically illustrate an exploded view and a top overlay view, respectively, of an example array comprising sixteen multiple-ion qubit gates in a 4×4 array in accordance with certain implementations described herein.
Figure 4B:
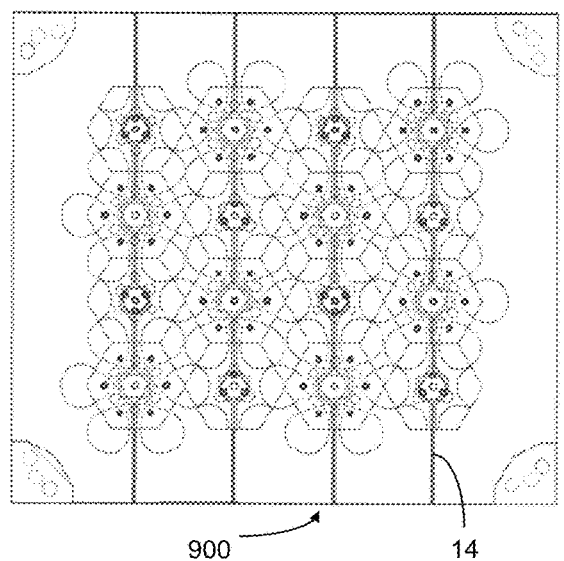

FIGS. 4A-4B schematically illustrate an exploded view and a top overlay view, respectively, of an example array 900 comprising sixteen multiple-ion qubit gates 902 in a 4×4 array in accordance with certain implementations described herein. Other multi-qubit gate arrays with different numbers of qubit gate arrays (e.g., more than sixteen) and/or in different geometric configurations (e.g., linear; rectangular; square; regular; irregular; symmetric; non-symmetric) are also compatible with certain implementations described herein. The sixteen multiple-ion qubit gates 902 of the array 900 are arranged substantially in a rectangular pattern with four rows each having four multiple-ion qubit gates 902 and four columns each having four multiple-ion qubit gates 902. The multiple-ion qubit gates 902 of each row comprise two four-ion qubit gates 100 and two thirteen-ion qubit gates 500 arranged alternately (e.g., "4-13-4-13") and the multiple-ion qubit gates 902 of each column comprise two four-ion qubit gates 100 and two thirteen-ion qubit gates 500 arranged alternately (e.g., "4-13-4-13"). The first (e.g., base) portions 810 of the array 900 are arranged such that any four nearest-neighboring first portions 810 comprise a one-ion portion 10, a three-ion portion 30, a six-ion portion 50, and a seven-ion portion 70, and the second (e.g., cap) portions 820 of the array 900 are arranged such that any four nearest-neighboring second portions 820 comprise a one-ion portion 10, a three-ion portion 30, a six-ion portion 50, and a seven-ion portion 70. In certain implementations, the layouts of the first portions 810 and second portions 820 of the array 900 (e.g., for a QFPGA) are configured to reduce (e.g., minimize) qubit-to-qubit spacing and/or to optimize cell-to-cell connectivity.

Figure 4C:
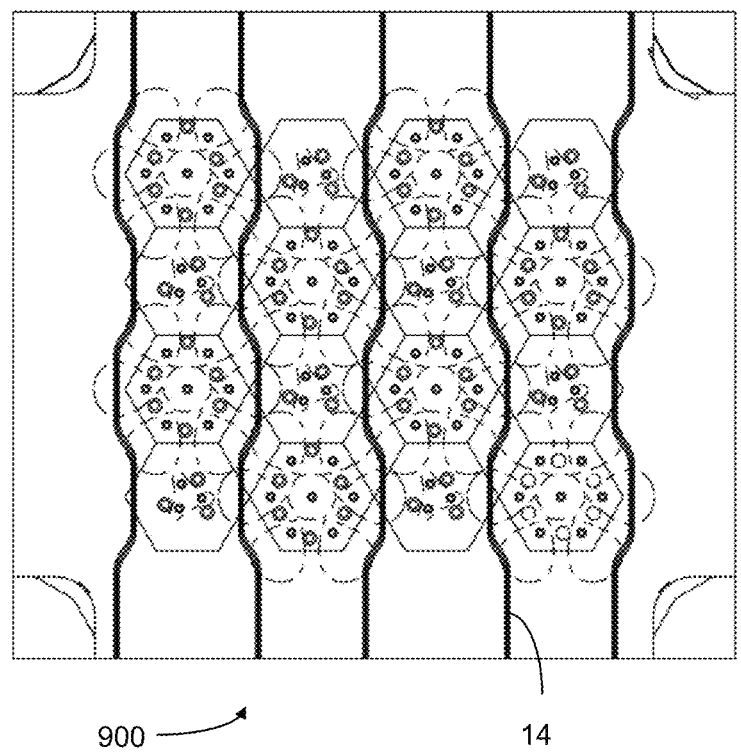
FIG. 4C schematically illustrates a top overlay view of another example multiple-ion qubit gate array with sixteen multiple-ion qubit gates in accordance with certain implementations described herein.

As schematically illustrated in FIGS. 4A-4B, at least some of the electrical traces 14 extending along the first substrate 600 and/or the second substrate 700 comprise substantially straight sections that are substantially perpendicular to the boundaries between neighboring first portions 810 of the first substrate 600 and/or the boundaries between neighboring second portions 820 of the second substrate 700. For example, the electrical traces 14 shown as being vertical in FIG. 4B are substantially perpendicular to the horizontal boundaries in FIG. 4B. FIG. 4C schematically illustrates a top overlay view of another example multiple-ion qubit gate array 900 with sixteen multiple-ion qubit gates 902 in accordance with certain implementations described herein. At least some of the electrical traces 14 extending along the first substrate 600 and/or the second substrate 700 in FIG. 4C comprise substantially straight section that are not substantially perpendicular to the boundaries between neighboring first portions 810 of the first substrate and/or the boundaries between neighboring second portions 820 of the second substrate 700. For example, the electrical traces 14 shown as being substantially vertical in FIG. 4C extend over at least some of the hexagonal boundaries in FIG. 4C but are not substantially perpendicular to these hexagonal boundaries. Other positions and/or orientations of the electrical traces 14 are also compatible with certain implementations described herein. For example, the electrical traces 14 can be curved so as to create room for optical ports for entry and/or exit of laser signals into the region between the first substrate 600 and the second substrate 700.

Figure 4D:
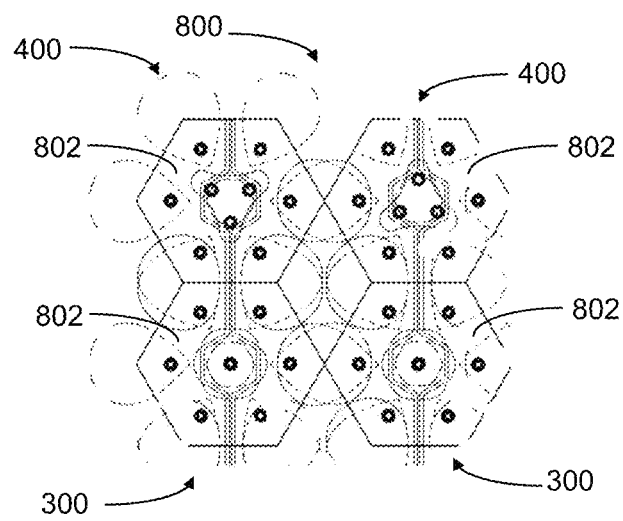
FIG. 4D schematically illustrates a top overlay view of another example multiple-ion qubit gate array comprising four multiple-ion qubit gates in accordance with certain implementation described herein.

FIG. 4D schematically illustrates a top overlay view of another example multiple-ion qubit gate array 800 comprising four multiple-ion qubit gates 802 in accordance with certain implementation described herein. The four multiple-ion qubit gates 802 comprise two eight-ion qubit gates 300 (see, e.g., FIG. 2B) and two nine-ion qubit gates 400 (see, e.g., FIG. 2C) between the first substrate 600 and the second substrate 700. One of the eight-ion qubit gates 300 comprises a seven-ion base portion 70 and a one-ion cap portion 10, another of the eight-ion qubit gates 300 comprises a one-ion base portion 10 and a seven-ion cap portion 70, one of the nine-ion qubit gates 400 comprises a three-ion base portion 30 and a six-ion cap portion 50, and another of the nine-ion qubit gates 400 comprises a six-ion base portion 50 and a three-ion cap portion 30.

Figure 4E:
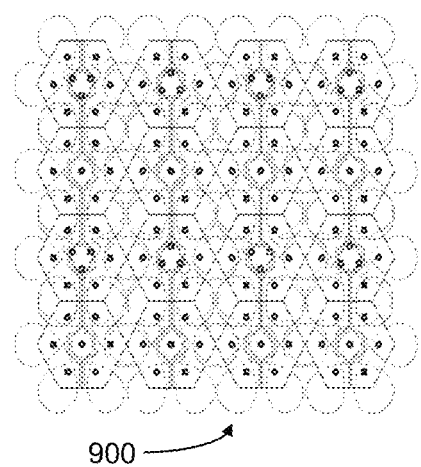
FIG. 4E schematically illustrates a top overlay view of another example multiple-ion qubit gate array comprising sixteen multiple-ion qubit gates in accordance with certain implementations described herein.

FIG. 4E schematically illustrates a top overlay view of another example multiple-ion qubit gate array 900 comprising sixteen multiple-ion qubit gates 902 in accordance with certain implementations described herein. The sixteen multiple-ion qubit gates 902 of the array 900 are arranged substantially in a rectangular pattern with four rows each having four multiple-ion qubit gates 902 and four columns each having four multiple-ion qubit gates 902. The rows of the multiple-ion qubit gates 902 are arranged alternately between four nine-ion qubit gates 400 (e.g., 9-9-9-9) and four eight-ion qubit gates 300 (e.g., "8-8-8-8") and the multiple-ion qubit gates 902 of each column comprise two nine-ion qubit gates 400 and two eight-ion qubit gates 300 arranged alternately (e.g., "9-8-9-8"). In certain implementations, the layouts of the first portions 810 and second portions 820 of the array 900 (e.g., for a QFPGA) are configured to provide consistent spacing between ions of neighboring first portions 810 and second portions 820 of the array 900.

Figure 4F:
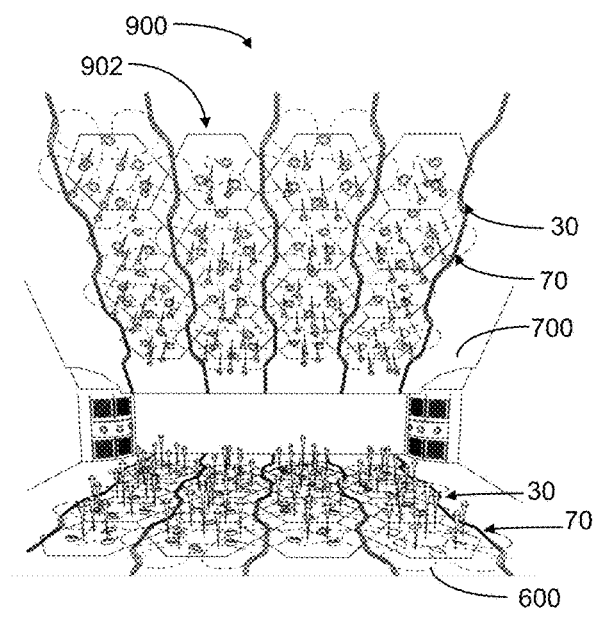
FIGS. 4F-4G schematically illustrate an exploded view and a top overlay view, respectively, of another example array comprising sixteen multiple-ion qubit gates in a 4×4 array in accordance with certain implementations described herein.
Figure 4G:
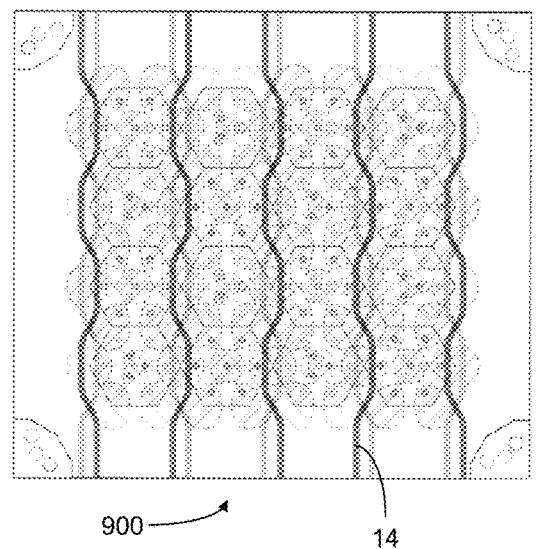

FIGS. 4F-4G schematically illustrate an exploded view and a top overlay view, respectively, of another example array 900 comprising sixteen multiple-ion qubit gates 902 in a 4×4 array in accordance with certain implementations described herein. The sixteen multiple-ion qubit gates 902 of the array 900 are arranged substantially in a rectangular pattern with four rows each having four multiple-ion qubit gates 902 and four columns each having four multiple-ion qubit gates 902. The multiple-ion qubit gates 902 of each row comprise four ten-ion qubit gates 450 and the multiple-ion qubit gates 902 of each column comprise four ten-ion qubit gates 450. The rows and columns of the first (e.g., base) portions 810 of the array 900 comprise three-ion portions 30 and seven-ion portions 70 arranged alternately (e.g., "3-7-3-7"), and the rows and columns of the second (e.g., cap) portions 820 of the array 900 are arranged alternately (e.g., "3-7-3-7"). In certain implementations, the layouts of the first portions 810 and second portions 820 of the array 900 are configured to provide more uniform spacing.

FIGS. 5A-5I schematically illustrate various views of portions of example QC structures 1000 in accordance with certain implementations described herein. The example QC structure 1000 can be used in a QASIC or a QFPGA layout. In certain implementations, the QC structure 1000 advantageously provides sufficient space for cooling systems and magnetic field systems for operating the QC structure 1000. In certain implementations, the overall configuration preserves channel space for electrical traces to control multiple electrodes per electrode region while advantageously addressing the problem of electrode overlap, which occurs between adjacent qubit gates in two-dimensional (2-D) layouts if they are tiled closely together (e.g., in an attempt to preserve usable coherence).

Figure 5A:
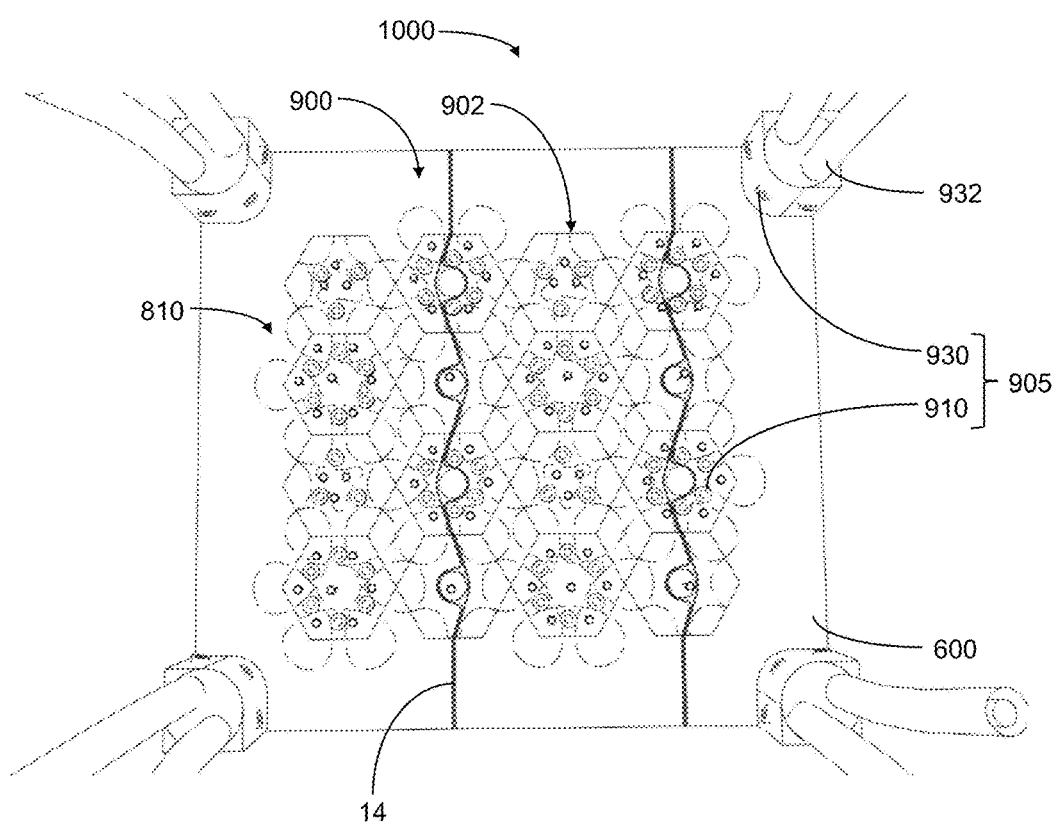
FIGS. 5A-5I schematically illustrate various views of portions of example QC structures in accordance with certain implementations described herein.

The example QC structure 1000 comprises the example array 900 of FIG. 4C and with electrical traces 14 that are similar to those of FIG. 4C. In certain implementations, the alternating inverted cell rows of the base and/or cap portions of the array 900 facilitate formation of electrical channels through which electrical signals can be provided to the ion traps of the array 900. For example, as shown in FIG. 5A, the electrical traces 14 are configured to provide electrical signals to the various electrodes of the ion traps. Other configurations of the cell rows and columns, electrical traces, as well as cells with other numbers of ions and/or qubits are also compatible with certain implementations described herein.

In certain implementations, the alternating inverted cell rows of the base and/or cap portions of the array 900 facilitate formation of optical channels through which optical signals can be inputted to and/or outputted from the ion traps of the array 900. The example QC structure 1000 further comprises a plurality of optical ports 905 in accordance with certain implementations described herein. The plurality of optical ports 905 of the example QC structure 1000 comprises a first plurality of optical ports 910 in optical communication with a first plurality of optical fibers 912, the first plurality of optical ports 910 within the first portions 810 of the first substrate 600. The plurality of optical ports 905 of the example QC structure 1000 further comprises a second plurality of optical ports 920 in optical communication with a second plurality of optical fibers 922, the second plurality of optical ports 920 within the second portions 820 of the second substrate 700. At least some of the optical ports 910 are configured to emit optical signals 914 (e.g., pulses generated by one or more lasers, not shown) configured to irradiate specific ions of the array 900 (e.g., for addressing and/or controlling specific qubits of the array 900) and at least some of the optical ports 920 are configured to emit optical signals 924 (e.g., pluses generated by one or more lasers, not shown) configured to irradiate specific ions of the array 900 (e.g., for addressing and/or controlling specific qubits of the array 900). The plurality of optical ports 905 of the example QC structure 1000 further comprises a third plurality of optical ports 930 and a third plurality of optical fibers 932. The optical ports 930 can be in optical communication with the third plurality of optical fibers 932, the third plurality of optical ports 930 positioned outside a periphery of the array 900 and configured to emit optical signals 934 (e.g., pulses generated by one or more lasers, not shown), the optical signals 934 configured to irradiate specific ions of the array 900 (e.g., for addressing and/or controlling specific qubits of the array 900). In certain implementations, the optical ports 910, 920, 930 comprise polished fiber ends configured to direct laser light signals 914, 924, 934 towards the corresponding specific ions of the array 900.

The plurality of optical ports 905 of the example QC structure 1000 further comprises a fourth plurality of optical exit ports 940 within the first portions 810 and/or the second portions 820 and configured to allow light from the optical signals 914, 924 passing the irradiated specific ions to exit or to be absorbed, so as to reduce (e.g., minimize) cross-talk or other noise from light reflection or scattering towards unintended qubits. The optical exit ports 940 can comprise holes and/or light absorptive material.

The example QC structure 1000 further comprises a plurality of optical detectors 950 in optical communication with a fourth plurality of optical fibers 952. The plurality of optical detectors 950 (e.g., charge-coupled device (CCD) cameras; superconducting single-photon nanowire detectors (SNSPDs); photomultiplier tubes (PMTs); bolometers) are configured to receive optical signals (e.g., fluorescent light 926) from ions of the array 900 for reading out the status of the qubits of the array 900.

FIG. 5A schematically illustrates a top view of the first portions 810 of the example array 900 on the first substrate 600, with the second substrate 700 removed. As shown in FIG. 5A, the electrical traces 14 can extend along the array 900 to provide electrical connectivity to the various electrodes of the first portions 810. The optical ports 910 can be positioned (e.g., interleaved) within the first portions 810 and oriented such that the optical signals 914 are directed towards specific ions of the second portions 820.

Figure 5B:
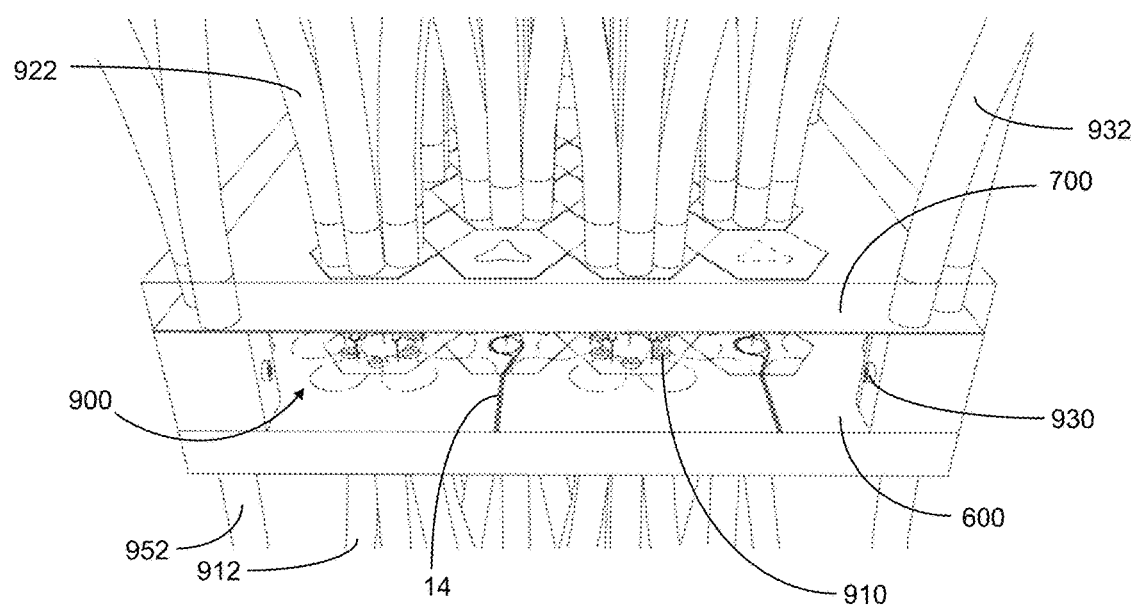
Figure 5C:
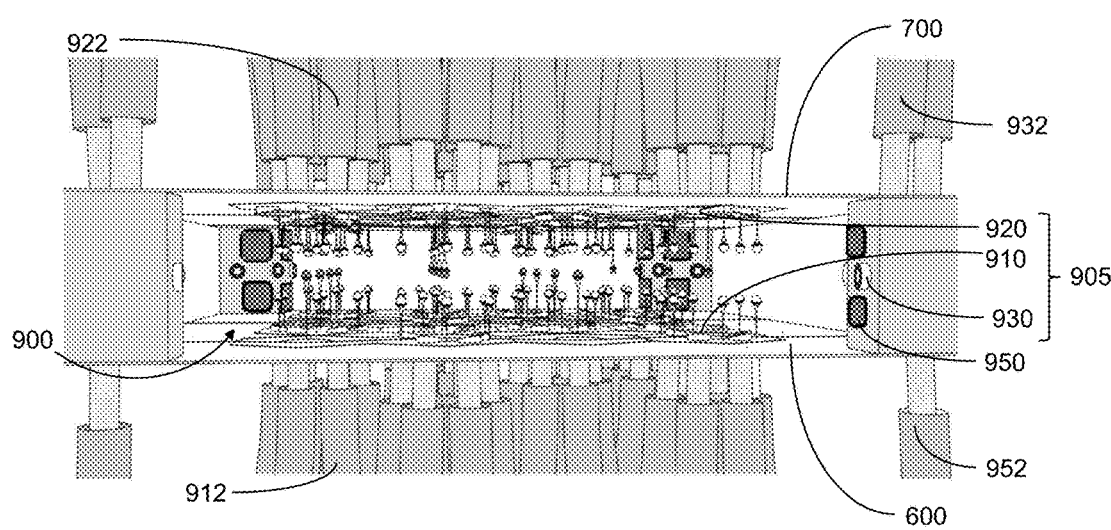

FIGS. 5B-5C schematically illustrate a perspective view and a side view, respectively, of the example QC structure 1000, including both the first and second substrates 600, 700 (e.g., multi-chip structure) of the example QC structure 1000.

Figure 5D:
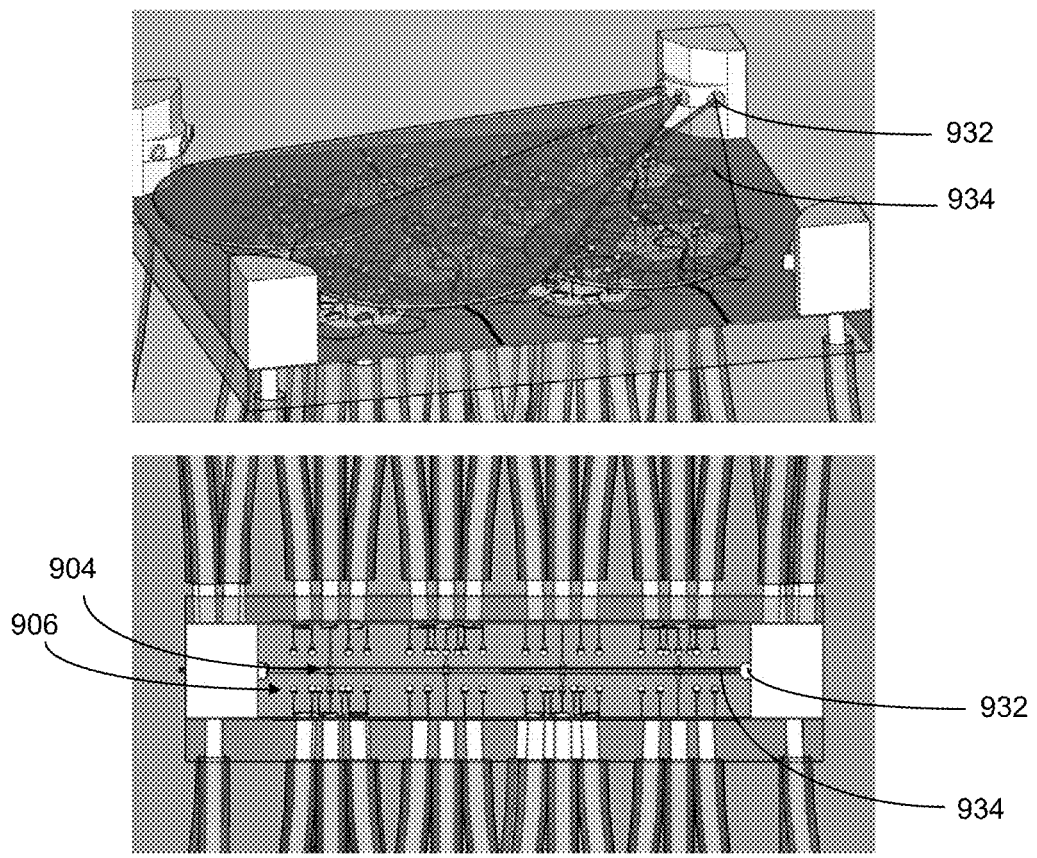

FIG. 5D schematically illustrates a perspective view (without the second substrate 700) and a side view (with both the first substrate 600 and the second substrate 700) of the example QC structure 1000 with the optical signals 934 emitted from the third plurality of optical ports 930. These optical signals 934 are directed to ions 904 positioned at the center of the multiple-ion qubit gates 902, which are at a different distance from the first substrate 600 and the second substrate 700 than are the other non-center ions 906 of the multiple-ion qubit gates 902.

Figure 5E:
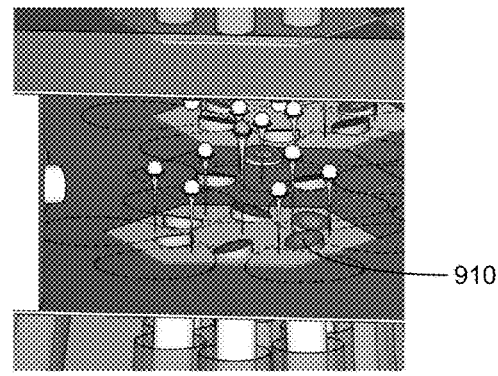
Figure 5F:
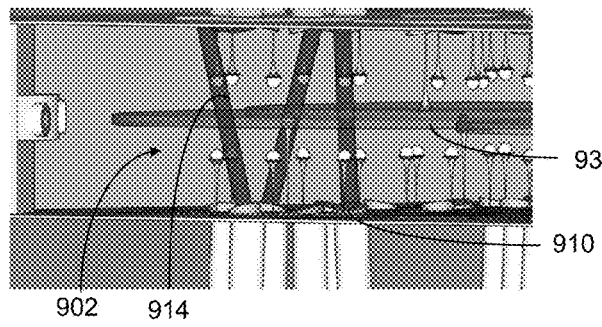
Figure 5G:
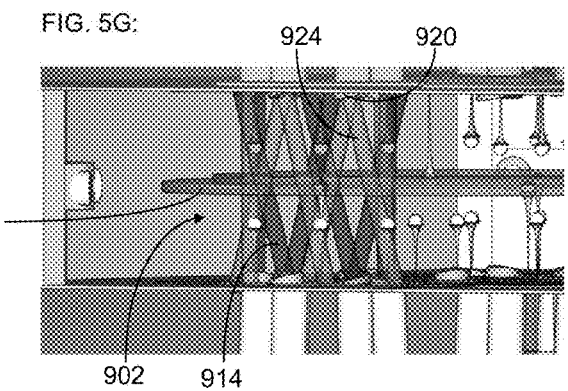
Figure 5H:
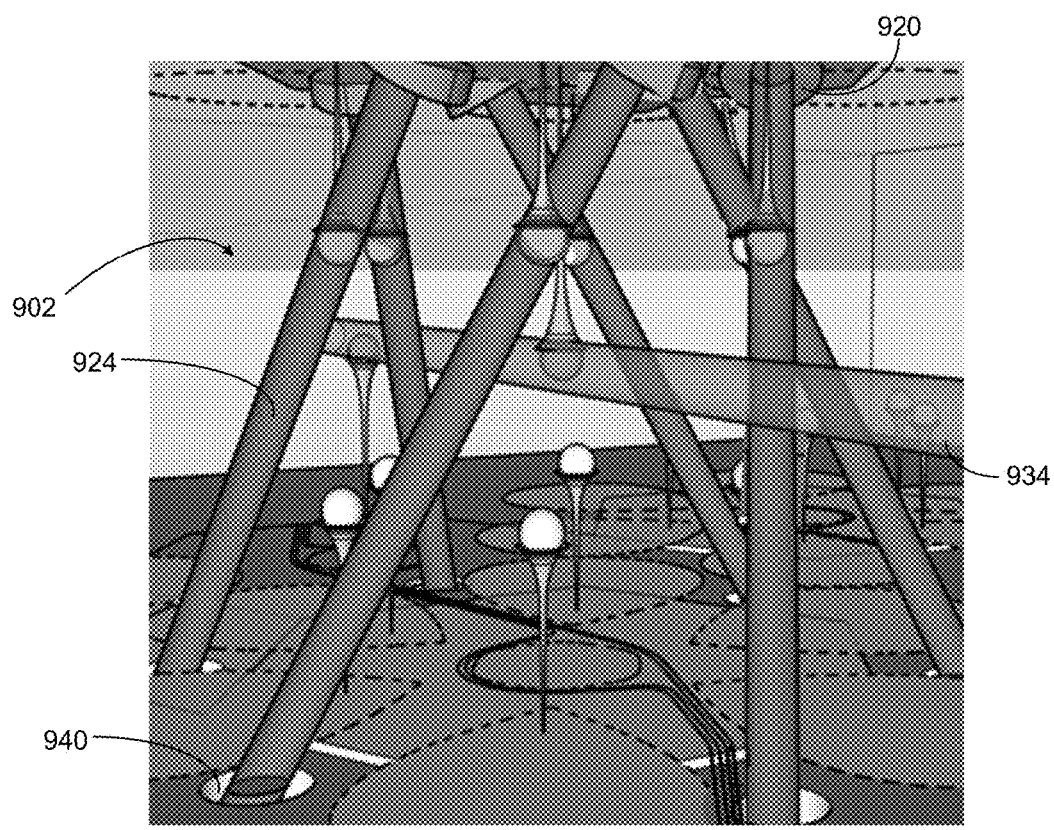

FIG. 5E schematically illustrates a perspective view (without the optical signals 914, 924), FIGS. 5F-5G schematically illustrate two side views of the example QC structure 1000, and FIG. 5H schematically illustrates another side view of the example QC structure 1000 in accordance with certain implementations described herein. FIG. 5F shows three of the optical signals 914 emitted from three of the first plurality of optical ports 910, each of the three optical signals 914 directed to a corresponding ion of the second portion 820 (e.g., a six-ion portion 50) of the multiple-ion qubit gate 902. In addition, FIG. 5F shows the optical signals 934 emitted from the third plurality of optical ports 930. FIG. 5G shows six of the optical signals 914 emitted from six of the first plurality of optical ports 910, each of the six optical signals 914 directed to a corresponding ion of the second portion 820 (e.g., a six-ion portion 50) of the multiple-ion qubit gate 902. In addition, FIG. 5G shows the optical signals 934 emitted from the third plurality of optical ports 930 and six of the optical signals 924 emitted from six of the second plurality of optical ports 920, each of the six optical signals 924 directed to a corresponding ion of the first portion 810 (e.g., a seven-ion portion 70) of the multiple-ion qubit gate 902. FIG. 5H shows the optical signals 924 emitted from the second plurality of optical ports 920 to irradiate corresponding ions, with some of the light from the optical signals 924 being allowed to exit via corresponding optical exit ports 940 (e.g., exiting the region between the first and second substrates 600, 700; being subsequently detected and/or absorbed).

Figure 5I:
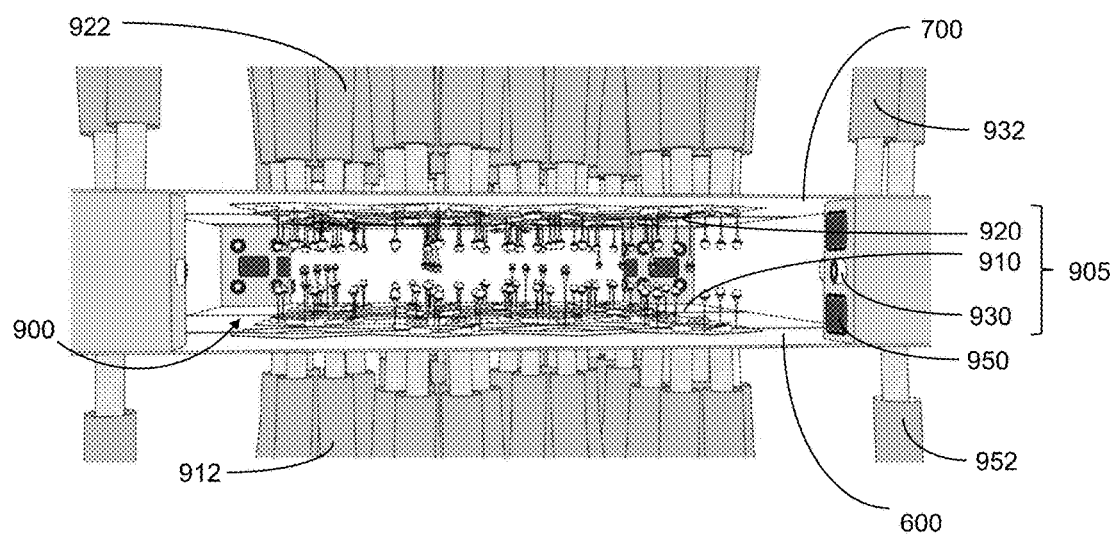

FIG. 5I schematically illustrates a side view of the example QC structure 1000 of FIGS. 5C-5D, with an additional row of optical ports 930 for emitting optical signals 934. For example, as shown in FIG. 5I, the back supports have two rows of optical ports 930 and one row of optical detectors 950, while the front supports have one row of optical ports 930 and two rows of optical detectors 950. In certain implementations, a plurality of optical signals can be used advantageously to utilize a plurality of ion species and to perform gate operations that are optimally suited to each ion species. The type of optical addressing and transitions employed to address, initialize and/or perform quantum gate operations on one or more ions can depend on the ion species used. For example, certain ion species can be addressed using single optical wavelength transitions and can be referred to as "optical qubits" (e.g., $^{40}$Ca+). In certain implementations, at least one optical signal 934 is used to illuminate a plurality of ions 904 (e.g. to initialize or reset their qubit states to the lowest energy, ground state). In certain implementations, at least one optical signal 934 is used to entangle a plurality of ions 904 and to perform certain quantum gate operations involving one or more ions. Certain other ion species can have hyperfine states and can be referred to as "hyperfine qubits" (e.g. $^{43}$Ca+; $^{171}$Yb+ and others); these typically employ two lasers in Raman transitions. In certain implementations, optical signals 934 of two different wavelengths are used advantageously to address and perform quantum gate operations on one or more ions.

Figure 6A:
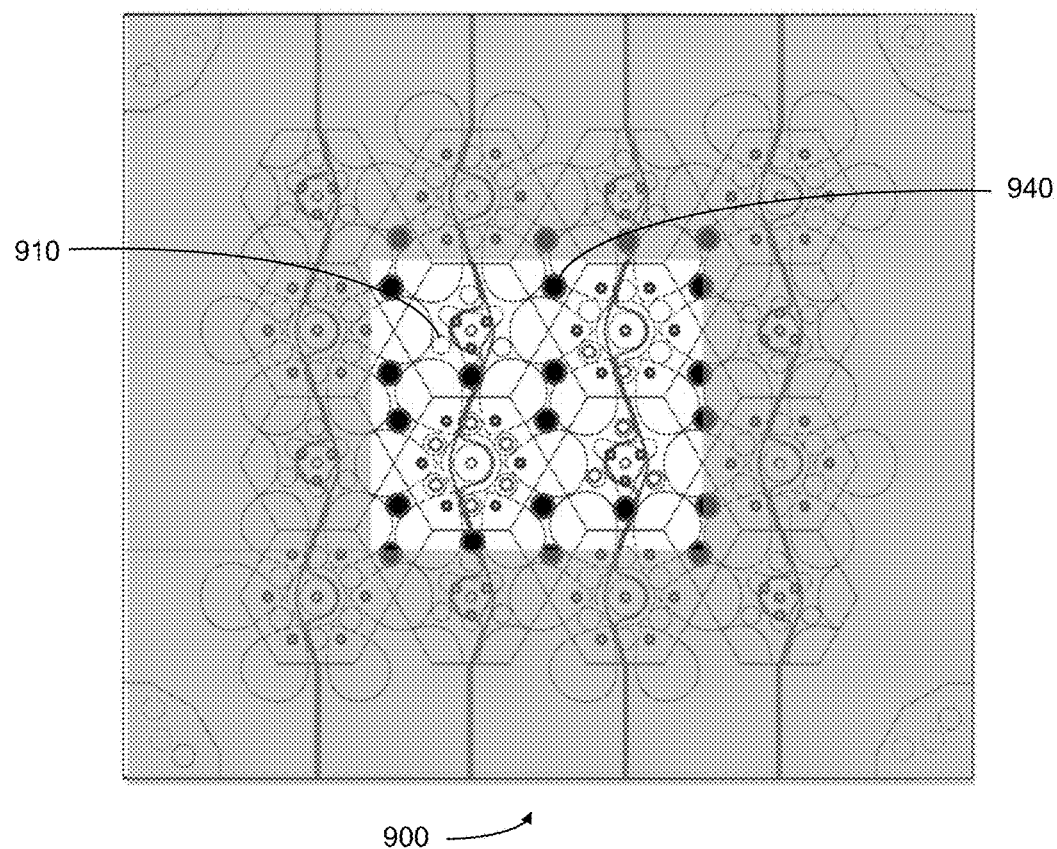
FIG. 6A schematically illustrates a top overlay view of an example 4×4 array of alternating four-ion qubit gates and thirteen-ion qubit gates with a plurality of optical ports in accordance with certain implementations described herein.

FIG. 6A schematically illustrates a top overlay view of an example 4×4 array 900 of alternating four-ion qubit gates 100 and thirteen-ion qubit gates 500 with a plurality of optical ports 905 in accordance with certain implementations described herein. The array 900 shown in FIG. 6A is an example of a QFPGA layout. At least some of the optical ports 910, 920 (denoted in FIG. 6A by white circles) are configured to emit optical signals 914, 924 into the region between the first substrate 600 and the second substrate 700 and at least some of the optical exit ports 940 (denoted in FIG. 6A by dark circles) are configured to allow the optical signals 914, 924 to exit and/or to be absorbed. The optical exit ports 940 in certain implementations are configured to prevent reflections of the optical signals 914, 924 from interfering or otherwise degrading performance of the example QC structure 1000. For example, the optical exit ports 940 can comprise optical absorbers. At least some of the optical ports 910, 920 and optical exit ports 940 can be positioned within the hexagonal first portions 810 and second portions 820 of the multiple-ion qubit gates 902, while at least some of the optical exit ports 940 can be positioned in the rhomboid regions 830, 840 between the hexagonal first and/or second portions 810, 820. For example, as shown in FIG. 6A, at least some of the optical ports 910, 920 and the optical exit ports 940 are positioned between the "petal-shaped" electrode regions 16 and some of the optical exit ports 940 are positioned in the rhomboid regions 830, 840.

Figure 6B:
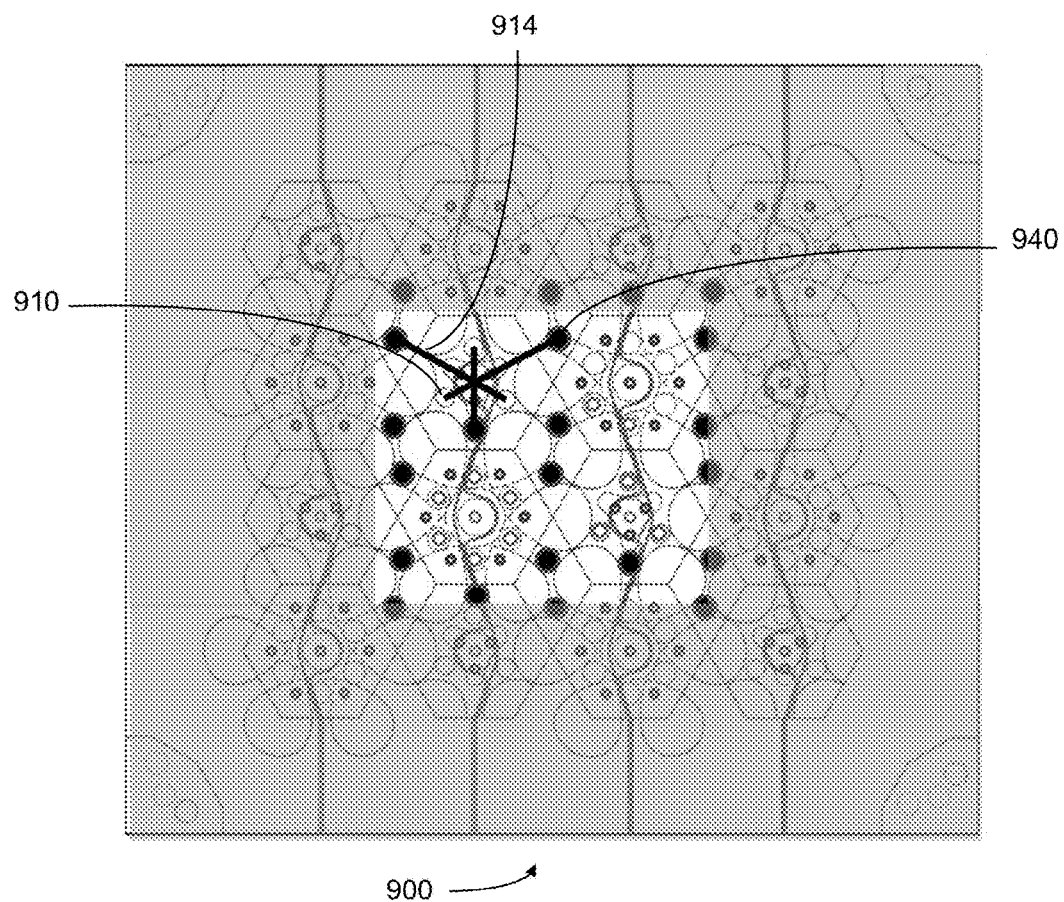
FIGS. 6B-6D schematically illustrate optical signals irradiating the ions of the array of FIG. 6A in accordance with certain embodiments described herein.
Figure 6C:
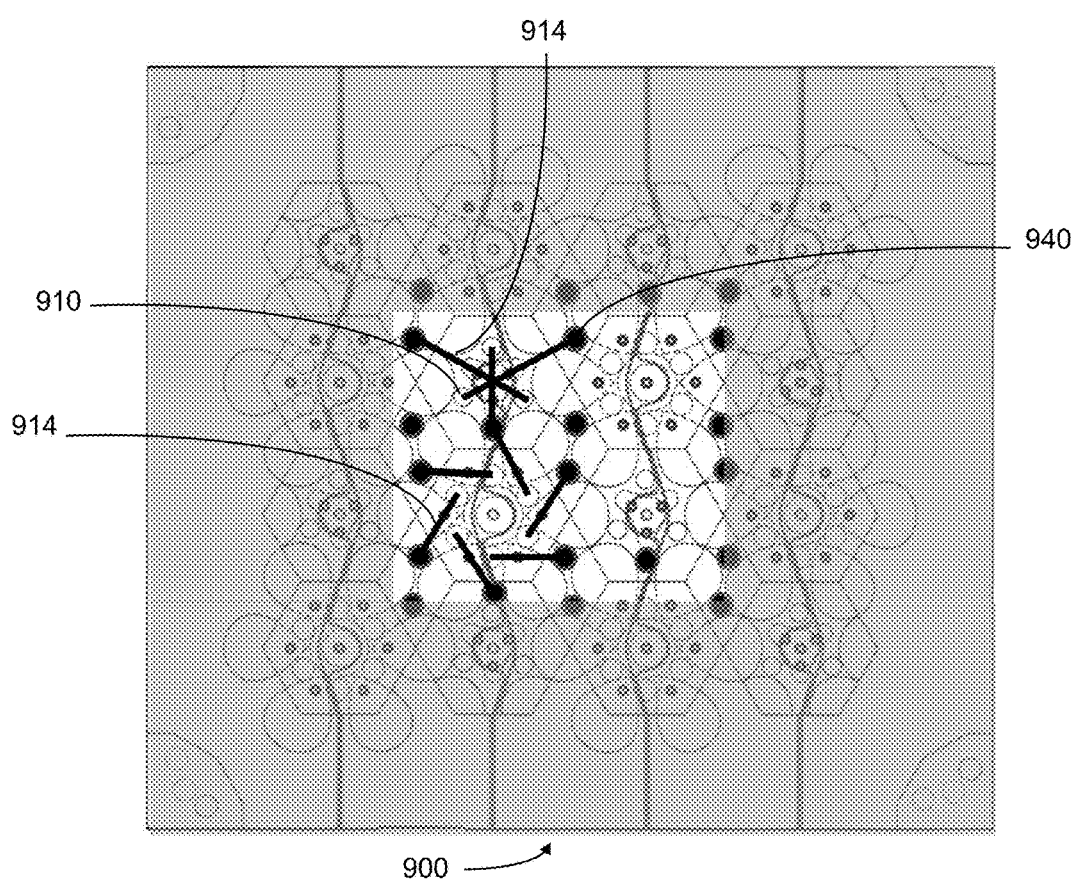
Figure 6D:
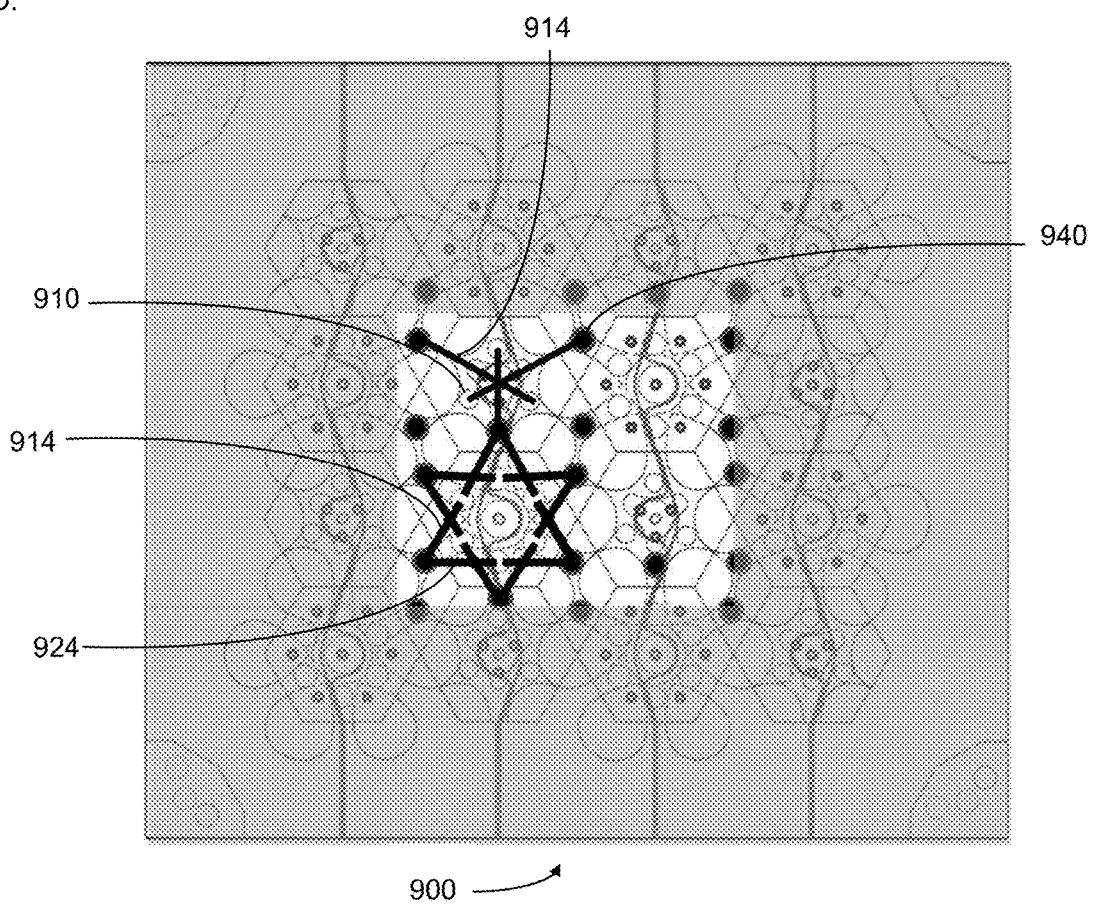

FIGS. 6B-6D schematically illustrate optical signals irradiating the ions of the array 900 of FIG. 6A in accordance with certain embodiments described herein. In each of FIGS. 6B-6D, the center ions of the four-ion qubit gate 100, the seven-ion qubit gate 200, and the thirteen-ion qubit gate 500 can be a laser-addressed and/or manipulated (e.g., target) ion and can be irradiated by optical signals from the optical ports 930 positioned outside a periphery of the array 900. The other ions of the our-ion qubit gate 100, the seven-ion qubit gate 200, and the thirteen-ion qubit gate 500 can be laser addressed (e.g., control) ions.

As shown in FIG. 6B, three of the optical ports 910 emit optical signals 914 which irradiate three corresponding ions of a four-ion qubit gate 100 and three of the optical exit ports 940 allow portions of the optical signals 914 passing the three corresponding ions to exit in order to reduce (e.g., minimize) light reflection or scattering within the array 900. In certain implementations, using the four-ion qubit gate 100 as a native $C^3$NOT gate, a single gate operation can advantageously exploit geometric symmetry and replace scores of 1- and 2-qubit gate operations, faster and with fewer aggregated errors.

As shown in FIG. 6C, six of the optical ports 910 emit optical signals 914 which irradiate six corresponding ions of a seven-ion qubit gate 200 and six of the optical exit ports 940 allow portions of the optical signals 914 passing the six corresponding ions to exit in order to reduce (e.g., minimize) light reflection or scattering within the array 900. In certain implementations, using the seven-ion qubit gate 200 as a native $C^6$NOT gate, a single gate operation can advantageously exploit geometric symmetry and replace hundreds of 1- and 2-qubit gate operations, faster and with fewer aggregated errors.

As shown in FIG. 6D, six of the optical ports 910 emit optical signals 914 and six of the optical ports 920 emit optical signals 924 which irradiate twelve corresponding ions of the thirteen-ion qubit gate 500 and twelve of the optical ports 940 allow portions of the optical signals 914, 924 passing the twelve corresponding ions to exit in order to reduce (e.g., minimize) light reflection or scattering within the array 900. In certain implementations, using the thirteen-ion qubit gate 500 as a native $C^{12}$NOT gate, a single gate operation can advantageously exploit geometric symmetry and replace thousands of 1- and 2-qubit gate operations, faster and with fewer aggregated errors.

Figure 6E:
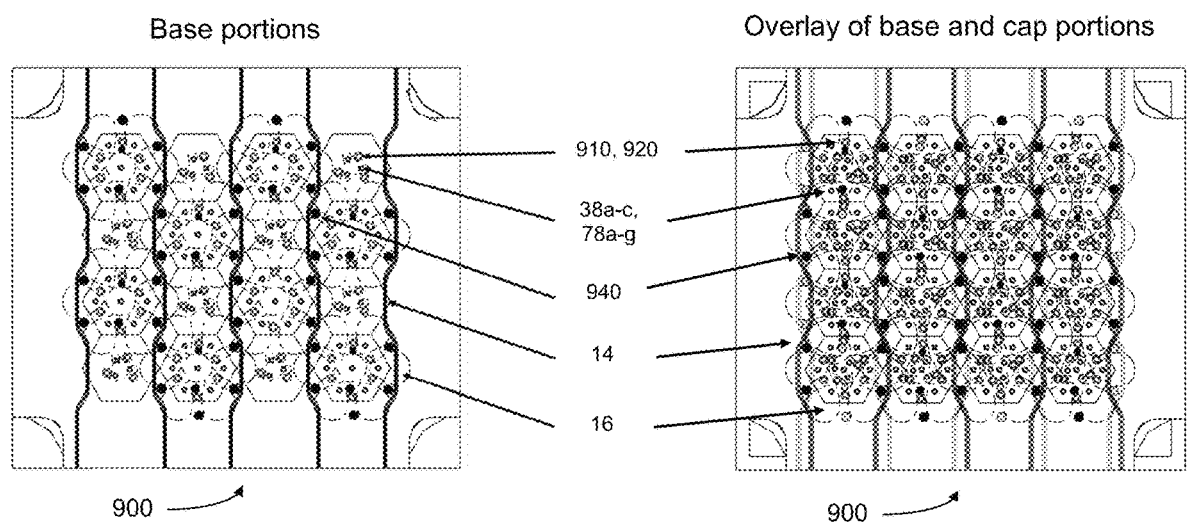
FIG. 6E schematically illustrates top views of the base portions and an overlay of the base and cap portions of another example 4×4 array of ten-ion qubit gates with a plurality of ion loading holes and optical ports in accordance with certain implementations described herein.

FIG. 6E schematically illustrates top views of the base portions and an overlay of the base and cap portions of an example 4×4 array 900 of ten-ion qubit gates 450 with a plurality of ion loading holes and optical ports 910, 920 in accordance with certain implementations described herein. The base portions comprises eight three-ion portions 30 and eight seven-ion portions 70 alternately arranged with one another, and the cap portions comprises eight three-ion portions 30 and eight seven-ion portions 70 alternately arranged with one another (see, e.g., FIGS. 4C, 4F, 4G).

Figure 6F:
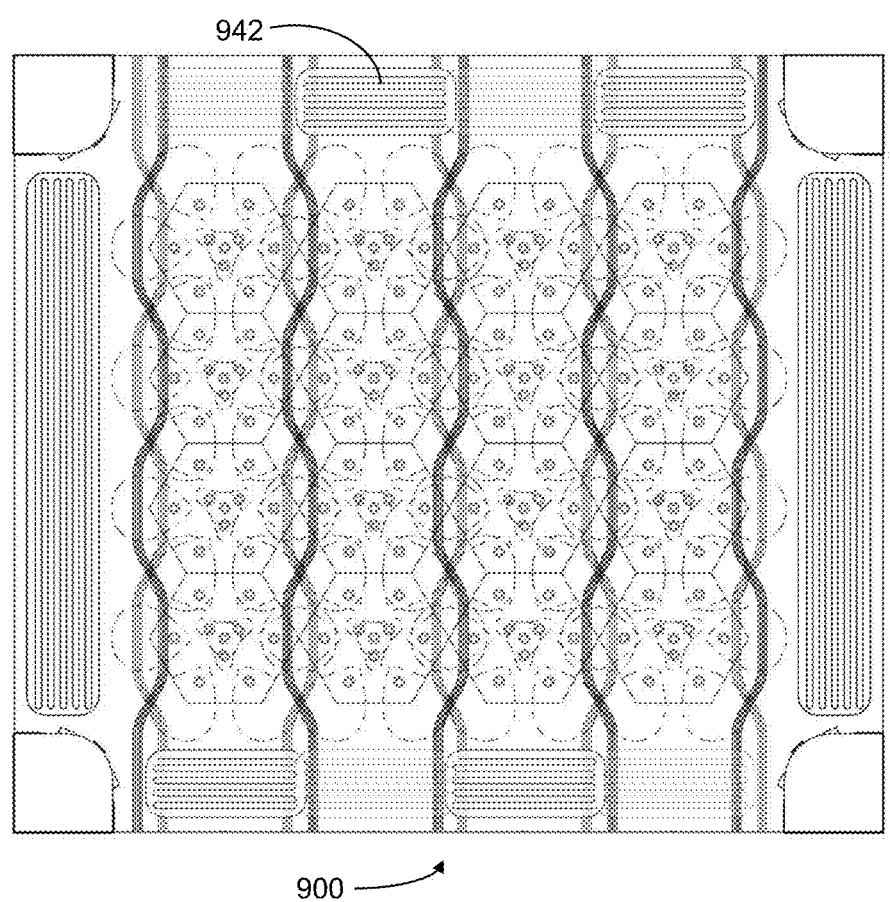
FIG. 6F schematically illustrates an overlay of the base and cap portions of another example 4×4 array of ten-ion qubit gates with a plurality of microwave antenna regions in accordance with certain implementations described herein.

FIG. 6F schematically illustrates an overlay of the base and cap portions of an example 4×4 array 900 of ten-ion qubit gates 450 with a plurality of microwave antenna regions 942 located on at least one chip substrate 600, 700 in accordance with certain implementations described herein. Depending the particular species of qubit(s) used (e.g., if the qubits include hyperfine qubit states, such as $^9$Be+; $^{43}$Ca+; $^{171}$Yb+ and many others), certain implementations described herein advantageously provide microwave addressing and control of the trapped ions in addition to or in lieu of certain optical methods (see e.g., C. Ospelkaus et al., Phys Rev. Lett. Vol 101, 090502 (2008); T. P. Harty et al., Phys Rev. Lett. Vol. 113, 220501 (2014)).

Figure 7A:
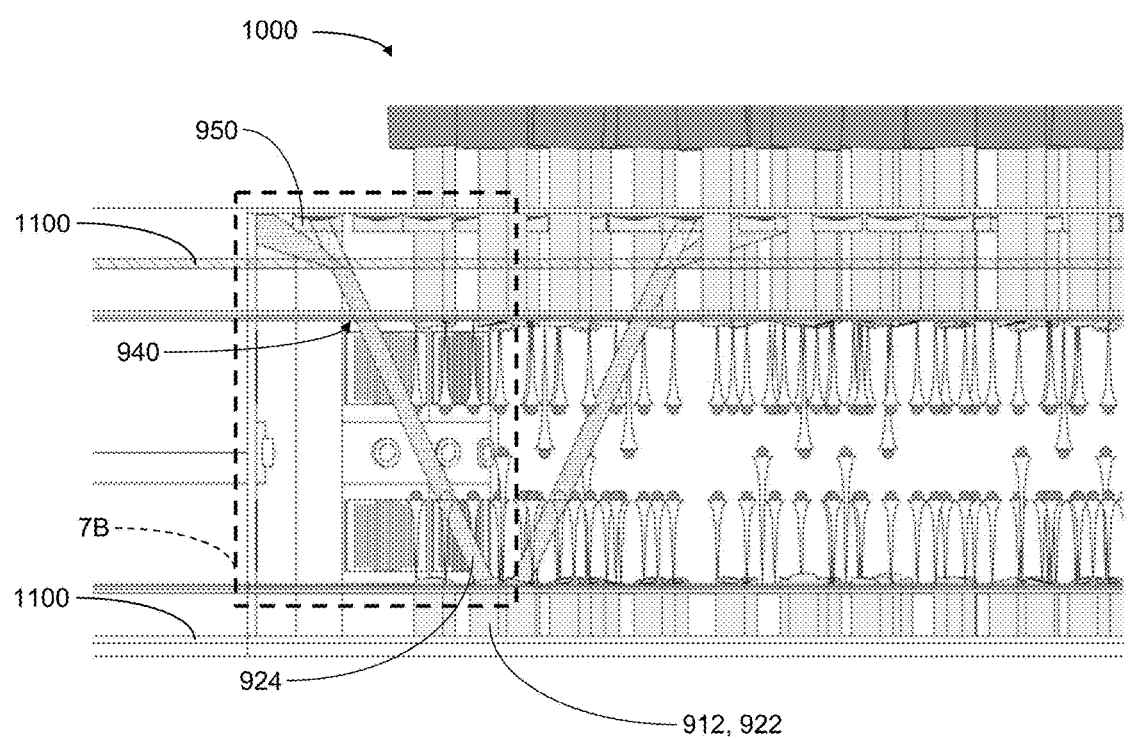
FIG. 7A schematically illustrates a side view of a portion of an example QC structure and FIG. 7B schematically illustrates a close-up view of a smaller portion of the QC structure of FIG. 7A in accordance with certain implementations described herein.
Figure 7B:
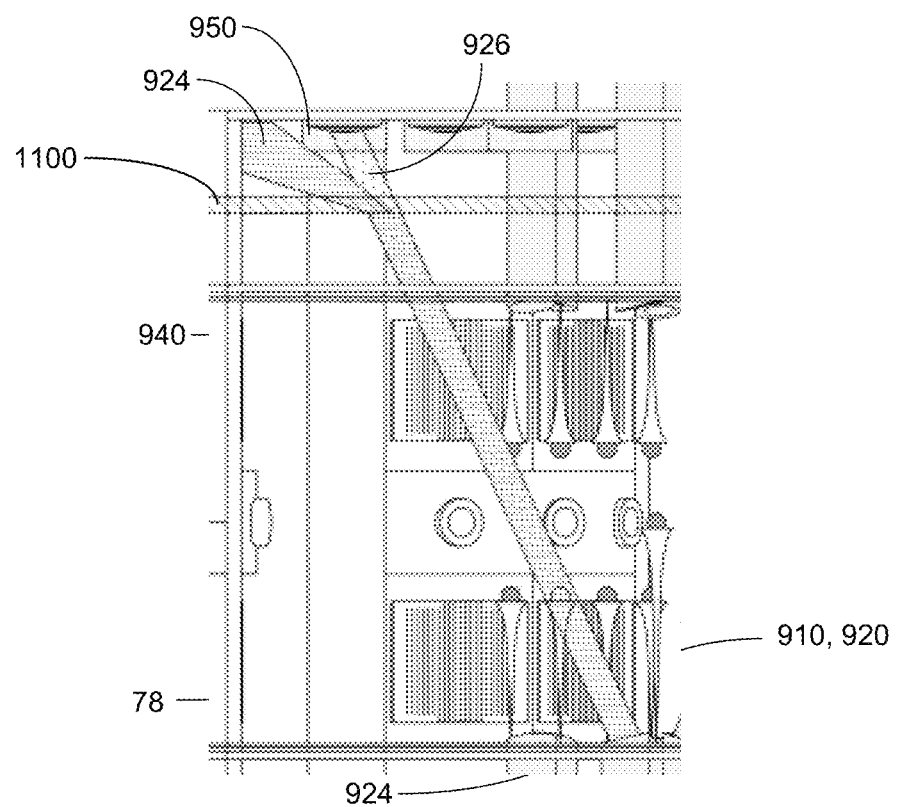
FIGS. 7C and 7D schematically illustrate two views of another example QC structure in accordance with certain implementations described herein.
FIG. 7E schematically illustrates ion loading holes and single-ion optical detectors in accordance with certain implementations described herein.

FIG. 7A schematically illustrates a side view of a portion of an example QC structure 1000 and FIG. 7B schematically illustrates a close-up view of a smaller portion of the QC structure 1000 of FIG. 7A in accordance with certain implementations described herein. As shown in FIG. 7A, optical signals 924 (e.g., light having a laser wavelength from ion-addressing lasers via the optical fibers 912, 922) emitted from the optical ports 910, 920 is directed to irradiate corresponding ions 18, 38, 58, 78. In response to the optical signals 924, the ions 18, 38, 58, 78 can fluoresce and emit fluorescent light 926. In certain implementations, the ion fluorescence wavelength can be at or near the laser wavelength of the optical signals 924, while in certain other implementations, the ion fluorescence wavelength is different from the laser wavelength of the optical signals 924. The light propagating to and passing through the optical exit ports 940 can comprise a mixture of the fluorescent light 926 from the irradiated ions 18, 38, 58, 78 and the optical signals 924 emitted from the optical ports 910, 920, as shown in FIG. 7B.

In certain implementations, as schematically illustrated by FIGS. 7A and 7B, the QC structure 1000 comprises at least one light-selective layer 1100 configured to separate the optical signal 924 from the fluorescent light 926. For example, as shown in FIGS. 7A and 7B, at least one light-selective layer 1100 comprises a wavelength-selective material positioned between the optical exit port 940 and the corresponding optical detector 950, and is configured to prevent (e.g., deflect; divert; refract; reflect; diffract) the optical signals 924 from reaching the optical detector 950 while allowing fluorescent light 926 to reach the optical detector 950 (e.g., to pass directly to the optical detector 950). Examples of light-selective layers 1100 configured to separate the optical signal 924 from the fluorescent light 926 in accordance with certain implementations described herein include but are not limited to: layers with wavelength-dependent refractive indices, prism-like layers, and diffraction gratings. In certain other implementations, at least one light-selective layer 1100 comprises a polarization-selective material (e.g., polarizing filter; birefringent crystal lattice) and/or a phase-selective material (e.g., quarter-wave plate; highly dispersive material; prism-like layer) configured to prevent (e.g., due to being orthogonally polarized and/or out of phase with) the optical signals 924 from reaching the optical detector 950 while allowing the fluorescent light 926 to reach the optical detector 950. In certain such implementations, the light-selective layer 1100 can reduce the intensity of the fluorescent light 926 by an allowable amount (e.g. approximately one-half; −3 dB) since the fluorescent light 926 comprises photons of random polarization and/or phases, half of which pass the light-selective layer 1100 whereas the optical signals 924 are blocked or highly attenuated resulting in a favorable signal to noise ratio of fluorescent light 926 reaching the optical detector 950. In certain implementations, the use of light-selective layers 1100 can be used in conjunction with pulse-timing of the optical signals 924 and gating the optical detector 950 readout to further increase signal-to-noise detection of fluorescent light 926 signals against the optical signals 924.

Figure 7C:
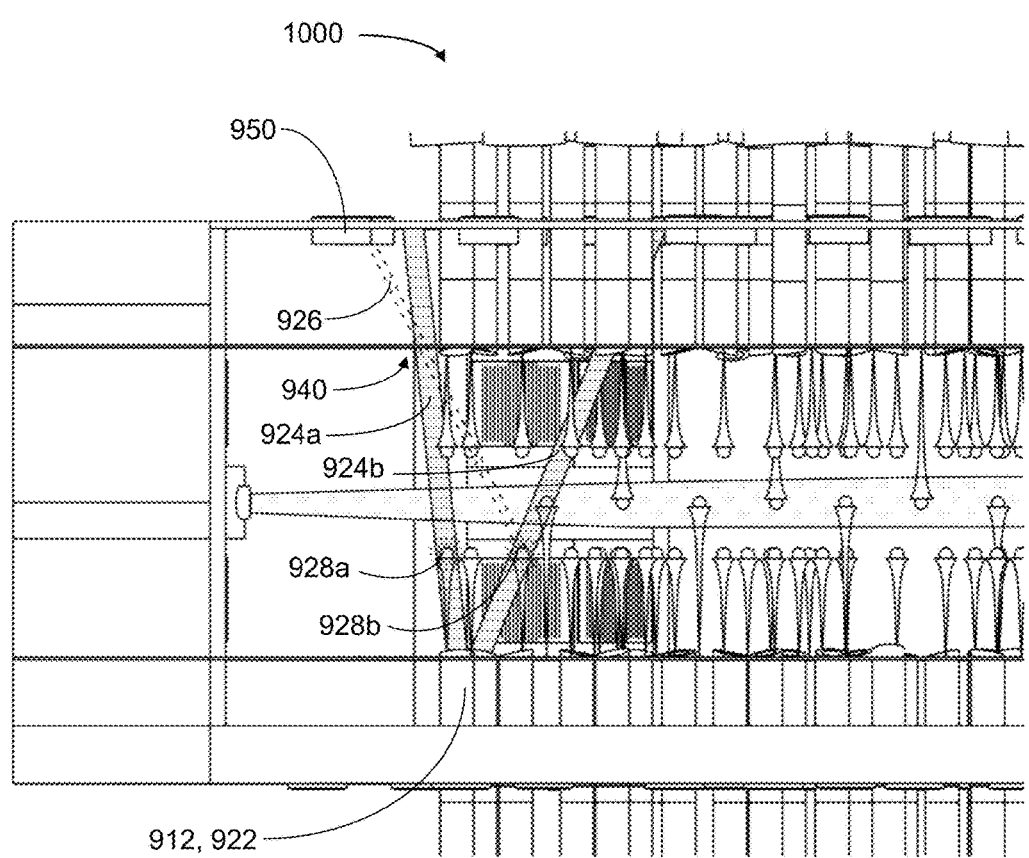
Figure 7D:
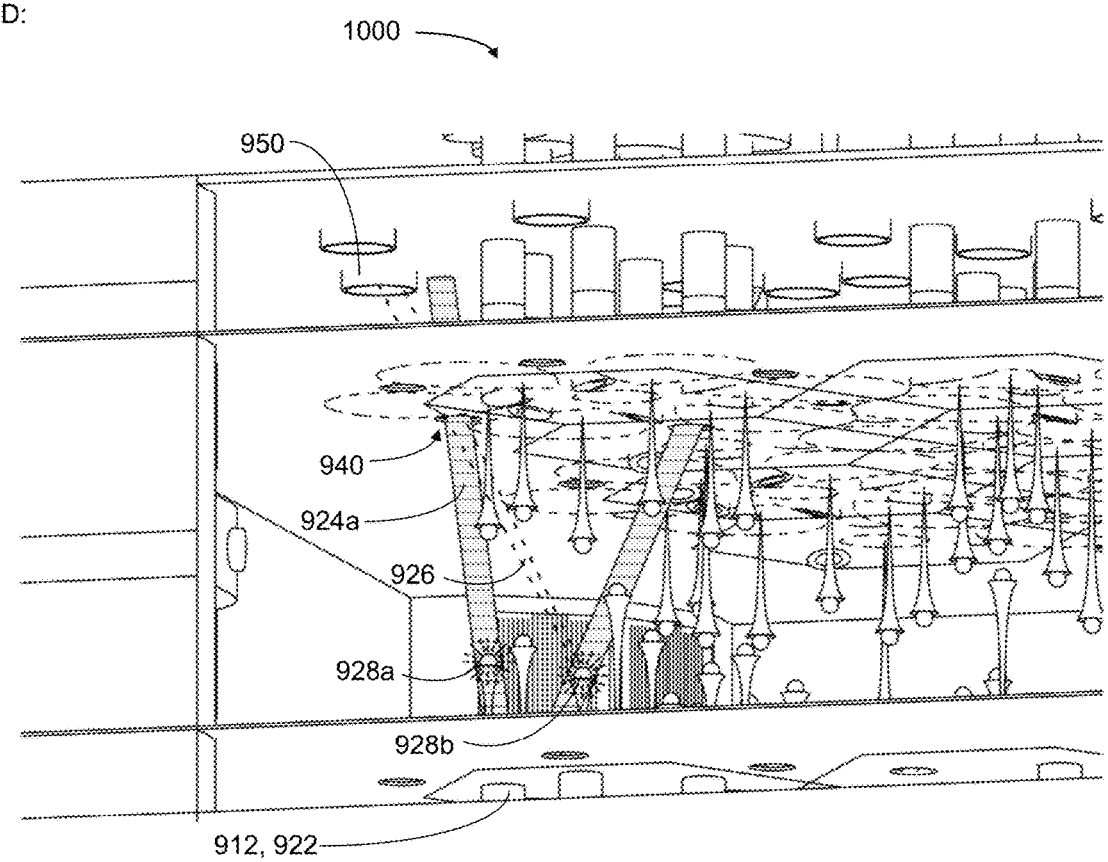

FIGS. 7C and 7D schematically illustrate two views of another example QC structure 1000 in accordance with certain implementations described herein. As schematically illustrated by FIGS. 7C and 7D, the QC structure 1000 has the optical exit ports 940 and the optical detectors 950 are positioned such that (i) optical signals 924a used to irradiate a first predetermined ion 928a propagate through a corresponding optical exit port 940 while not reaching the optical detector 950 corresponding to the optical exit port 940 and (ii) fluorescent light 926 from a second predetermined ion 928b propagates from the ion 928b through the optical exit port 940 to the corresponding optical detector 950 while the optical signals 924 (e.g., either irradiating the ion 924b or other ions) do not propagate through the optical exit port 940 to the corresponding optical detector 950. For example, certain such configurations can be useful for QC structures 1000 in which the fluorescent light 926 and the optical signals 924 are not readily distinguishable from one another (e.g., by wavelength, polarization, and/or phase).

Figure 7E:
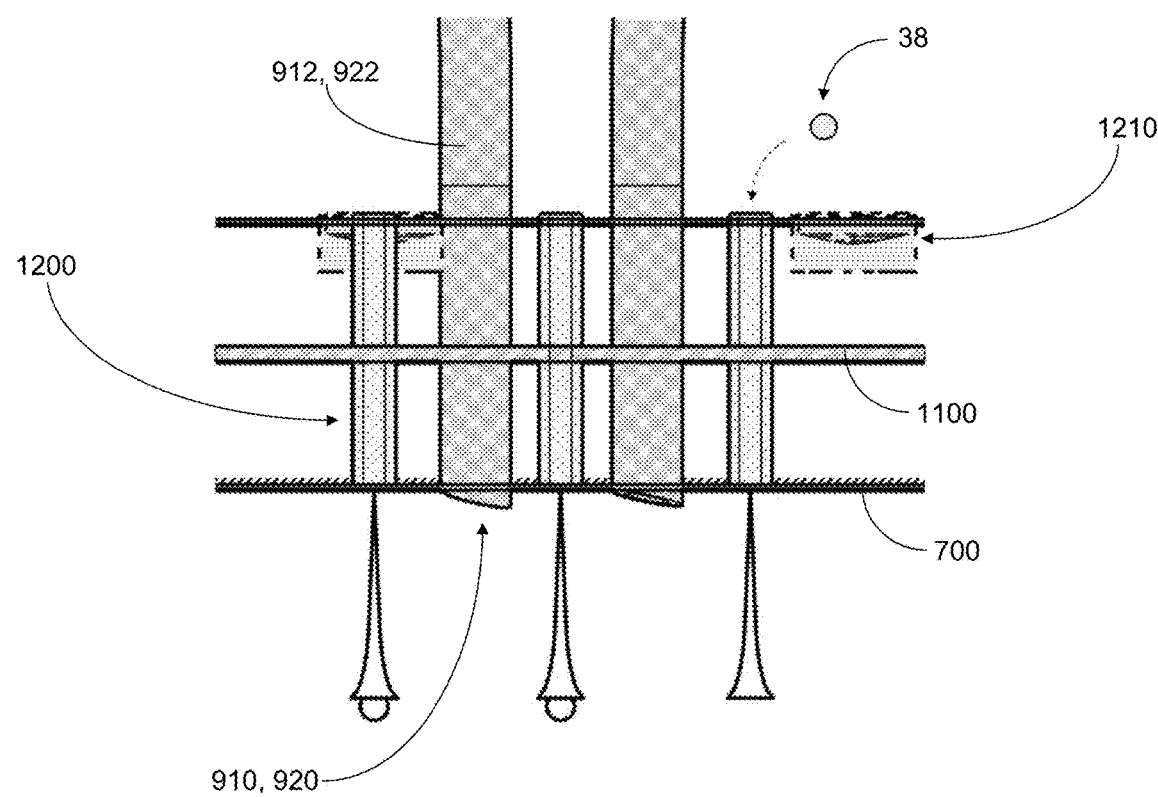

FIG. 7E schematically illustrates a side view of a portion of an example QC structure 1000 comprising ion loading holes 1200 (e.g., vertical interconnects (VIAs), through-silicon vias (TSVs); carbon nanotube (CNT) structures) and single-ion optical detectors 1210 (e.g., charge-coupled devices (CCDs); PMTs; SNSPDs; bolometers) in accordance with certain implementations described herein. In certain implementations, the ion loading holes 1200 are configured to introduce the ions 18, 38, 58, 78 into the corresponding electropotential wells 17, 37, 57, 77 and to be controllably opened and/or closed in response to signals from a corresponding single-ion optical detector 1210. For example, upon the single-ion optical detector 1210 detecting that a single ion has passed through the corresponding ion loading hole 1200, the single-ion optical detector 1210 can close the ion loading hole 1200 so that additional ions do not pass through. Upon the corresponding electropotential well 17, 37, 57, 77 not containing an ion 18, 38, 58, 78, the single-ion optical detector 1210 can open the ion loading hole 1200 so that a single ion 18, 38, 58, 78 is supplied to the electropotential well 17, 37, 57, 77.

Figure 8:
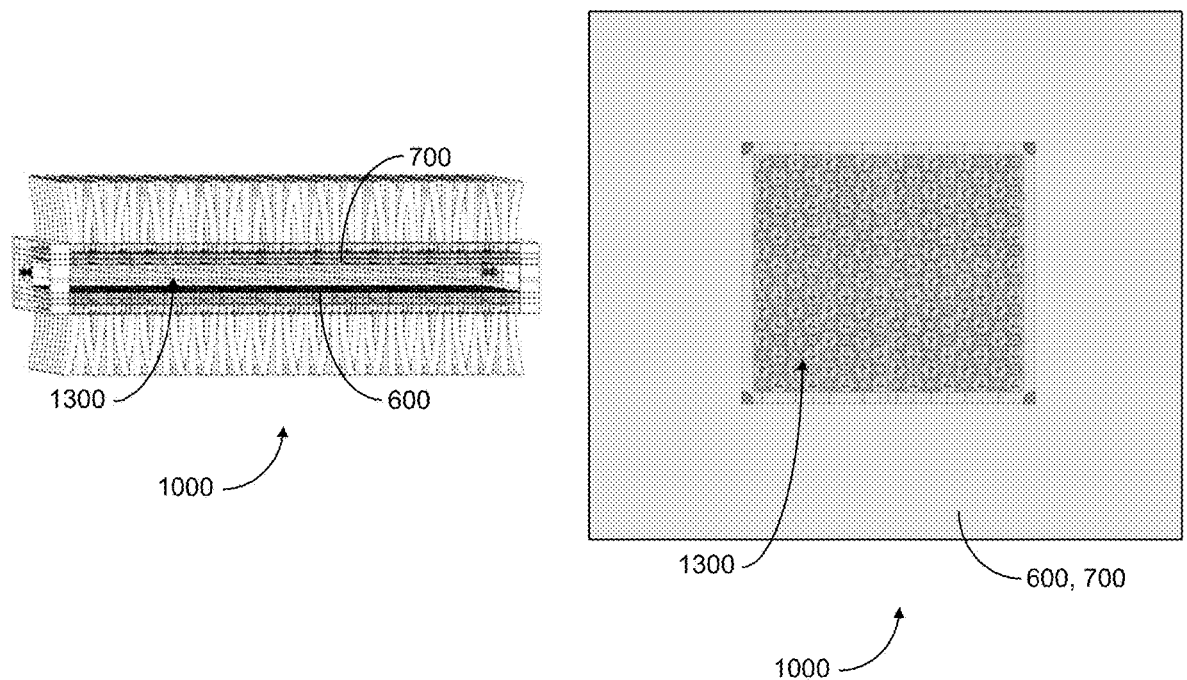
FIG. 8 schematically illustrates a side view and a top projection view of an example QC structure having an example 16×16 cell array in accordance with certain implementations described herein.

FIG. 8 schematically illustrates a side view of an example QC structure 1000 having an example 16×16 cell array 1300 (left-side of FIG. 8A) and a top projection view of the 16×16 cell array 900 (right-side of FIG. 8) in accordance with certain implementations described herein. The 16×16 cell array 1300 of FIG. 8 comprises sixteen of the 4×4 cell arrays 900 of FIGS. 5A-5D tiled with one another. As shown in the right-side of FIG. 8, the 16×16 cell array 1300 can be scaled to an area of about one-quarter square centimeter (0.25 cm$^2$) on nominal one square centimeter (1 cm$^2$) substrates 600, 700. For example, the 16×16 cell array 1300 can have alternating 4-ion gate arrays 100 and thirteen-ion gate arrays 500 to enable 16,437 qubits within the area of the substrates 600, 700 (e.g., using inter-trap spacings on the order of 40 microns). For another example, the 16×16 cell array 1300 can include only 10-ion gate arrays 450 to enable 19,400 qubits within the area of the substrates 600, 700 (e.g., using inter-trap spacings on the order of 40 microns).

If the QC structure 100 comprises a cell array having a larger number of cells and extending over a larger area, the number of qubits can be increased. For example, a cell array having alternating 4-ion gate arrays 100 and thirteen-ion gate arrays 500 across an area of 1 cm$^2$ can enable 65,750 qubits per square centimeter (e.g., using inter-trap spacings on the order of 40 microns) and a cell array having only 10-ion gate arrays 450 across the area of 1 cm$^2$ can enable over 77,000 qubits per square centimeter (e.g., using inter-trap spacings on the order of 40 microns).

FIG. 9 shows four tables comparing the total number of qubits for various 4×4 cell arrays in accordance with certain implementations described herein and examples of how reconfigurability of the arrays advantageously enables multiple complementary attributes to be selected. As shown in FIG. 9, for a 4×4 cell array having alternating eight 4-ion gate arrays 100 and eight 13-ion gate arrays 500 (e.g., denoted "QFPGA I" in FIG. 9), the total number of qubits is 136. This represents a relatively low qubit density within the overall trade space yet the interspersal of extra high capacity gates with adjacent lower capacity gates presents opportunities for error correction be performed efficiently in situ and/or for running algorithms that benefit from multiply-controlled NOT or multiply-controlled phase gates with large numbers of (e.g. 10 or more) controls. For a 4×4 cell array having six 4-ion gate arrays 100, seven 10-ion gate arrays 450, and three 13-ion gate arrays 500 (e.g., denoted "QASIC I in FIG. 9), the total number of qubits is 133. However, for an example ASIC-type usage (e.g., where a few $C^{12}$NOT gates are used but greater relay speed or throughput across the array is desired), QASIC I can be more efficient than QFPGA I despite having three fewer qubits in its array. For a 4×4 cell array having sixteen 10-ion gate arrays 450 (e.g., denoted "QFPGA II" in FIG. 9), the total number of qubits is 160. This is the highest qubit density presented for an array, with the most efficient throughput across all directions and the most uniform design. For a 4×4 cell array having four 4-ion gate arrays 100, ten 10-ion gate arrays 450, and two 13-ion gate arrays 500 (e.g., denoted "QASIC II in FIG. 9), the total number of qubits is 142. This is toward the middle of the range of qubit densities, nevertheless such an array could be advantageous in special ASIC-type uses in which a modest number of $C^{12}$NOT gates are used and the direction of highest relay speed or throughput can be predefined (e.g., from lower left to upper right and vice versa).

The invention has been described in several non-limiting implementations. It is to be understood that the implementations are not mutually exclusive, and elements described in connection with one implementation may be combined with, rearranged, or eliminated from, other implementations in suitable ways to accomplish desired design objectives. No single feature or group of features is necessary or required for each implementation.

For purposes of summarizing the present invention, certain aspects, advantages and novel features of the present invention are described herein. It is to be understood, however, that not necessarily all such advantages may be achieved in accordance with any particular implementation. Thus, the present invention may be embodied or carried out in a manner that achieves one or more advantages without necessarily achieving other advantages as may be taught or suggested herein.

As used herein any reference to "one implementation" or "some implementations" or "an implementation" means that a particular element, feature, structure, or characteristic described in connection with the implementation is included in at least one implementation. The appearances of the phrase "in one implementation" in various places in the specification are not necessarily all referring to the same implementation. Conditional language used herein, such as, among others, "can," "could," "might," "may," "e.g.," and the like, unless specifically stated otherwise, or otherwise understood within the context as used, is generally intended to convey that certain implementations include, while other implementations do not include, certain features, elements and/or steps. In addition, the articles "a" or "an" or "the" as used in this application and the appended claims are to be construed to mean "one or more" or "at least one" unless specified otherwise.

Language of degree, as used herein, such as the terms "approximately," "about," "generally," and "substantially," represent a value, amount, or characteristic close to the stated value, amount, or characteristic that still performs a desired function or achieves a desired result. For example, the terms "approximately," "about," "generally," and "substantially" may refer to an amount that is within ±10% of, within ±5% of, within ±2% of, within ±1% of, or within ±0.1% of the stated amount. As another example, the terms "generally parallel" and "substantially parallel" refer to a value, amount, or characteristic that departs from exactly parallel by ±10 degrees, by ±5 degrees, by ±2 degrees, by ±1 degree, or by ±0.1 degree, and the terms "generally perpendicular" and "substantially perpendicular" refer to a value, amount, or characteristic that departs from exactly perpendicular by ±10 degrees, by ±5 degrees, by ±2 degrees, by ±1 degree, or by ±0.1 degree. The ranges disclosed herein also encompass any and all overlap, sub-ranges, and combinations thereof. Language such as "up to," "at least," "greater than," less than," "between," and the like includes the number recited. As used herein, the meaning of "a," "an," and "said" includes plural reference unless the context clearly dictates otherwise. Also, as used in the description herein, the meaning of "in" includes "into" and "on," unless the context clearly dictates otherwise.

As used herein, the terms "comprises," "comprising," "includes," "including," "has," "having" or any other variation thereof, are open-ended terms and intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), or both A and B are true (or present). As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain implementations require at least one of X, at least one of Y, and at least one of Z to each be present.

Thus, while only certain implementations have been specifically described herein, it will be apparent that numerous modifications may be made thereto without departing from the spirit and scope of the invention. Further, acronyms are used merely to enhance the readability of the specification and claims. It should be noted that these acronyms are not intended to lessen the generality of the terms used and they should not be construed to restrict the scope of the claims to the implementations described therein.

What is claimed is:

1. A quantum computing (QC) system comprising:
a first substrate and a second substrate, the first substrate and the second substrate substantially parallel to one another;
a plurality of qubits arranged substantially in a plurality of substantially planar regions that are substantially parallel to one another, the plurality of qubits arranged as a gate array comprising a plurality of gates with each gate of the plurality of gates comprising a first portion at a surface of the first substrate and a second portion at a surface of the second substrate, each gate of the plurality of gates comprising multiple qubits that are positioned between the first substrate and the second substrate, with the qubits at or near a surface of at least one of the first and second substrates, the first portion of each gate of the gate array is being selected from the group consisting of: a portion comprising one qubit, a portion comprising three qubits, a portion comprising six qubits, and a portion comprising seven qubits and the second portion of each gate of the gate array being selected from the group consisting of: a portion comprising one qubit, a portion comprising three qubits, a portion comprising six qubits, and a portion comprising seven qubits;
a first substantially planar region of the plurality of substantially planar regions comprising at least one qubit; and
a second substantially planar region of the plurality of substantially planar regions comprising multiple qubits,
wherein a first qubit of the at least one qubit is configured to be simultaneously entangled with at least two second qubits of the multiple qubits.

2. A quantum computing (QC) system comprising a plurality of qubit gates comprising ions that are configured to be fully connected and simultaneously entangled with one another, the plurality of qubit gates arranged in a substantially rectangular lattice having a plurality of rows and a plurality of columns, the plurality of qubit gates configured to provide simultaneous gate operations of two or more of the qubit gates.

3. The system of claim 2, wherein the qubit gates of at least one row of the plurality of rows and/or at least one column of the plurality of columns comprise qubit gates each comprising four ions and qubit gates each comprising thirteen ions, the qubit gates arranged alternatively.

4. The system of claim 2, wherein the qubit gates of at least one row of the plurality of rows and/or at least one column of the plurality of columns comprise a plurality of qubit gates each comprising ten ions.

5. The system of claim 2, wherein the qubit gates of at least one row of the plurality of rows and/or at least one column of the plurality of columns comprise a qubit gate comprising four ions, a qubit gate comprising thirteen ions, and/or a plurality of qubit gates each comprising ten ions.

6. The system of claim 2, wherein the qubit gates comprise one of the following:
equal numbers of qubit gates each comprising four ions and qubit gates each comprising thirteen ions, alternating with one another along each row and each column; and
all of the qubit gates of the lattice comprising qubit gates each comprising ten ions.

7. A quantum computing (QC) system comprising a plurality of three dimensional (3-D) gate cells, each 3-D gate cell comprising at least three qubits configured to be fully connected simultaneously with one another across three dimensions, the plurality of 3-D gate cells configured to perform gate operations of two or more of the 3-D gate cells.

8. The system of claim 7, wherein the plurality of 3-D gate cells comprises ion trap arrays that are configured to have coherent connectivity or entanglement directly between qubits without photonic interconnects between the qubits.

9. The system of claim 7, wherein the 3-D gate cells have a geometrically symmetric arrangement and are configured to operate natively, in a single gate operation, without reliance on concatenations of multiple qubit gates each comprising one qubit or two qubits.

10. The system of claim 7, wherein the gate cells comprise asymmetric 3-D structures with complementary bases and caps arranged in alternating orientations with interleaving of non-identical neighboring cell bases and caps.

11. The system of claim 7, wherein the plurality of 3-D gate cells are components of at least one quantum FPGA (QFPGA) and/or ASIC (QASIC) chip.

12. A quantum computing (QC) system comprising an array of three dimensional (3-D) gate cells comprising multiple qubits, the array comprising one or more gates comprising fourteen qubits, thirteen qubits, ten qubits, nine qubits, eight qubits, seven qubits, and/or four qubits.

13. The system of claim 12, further comprising a first substrate and a second substrate, the first substrate and the second substrate being substantially planar and parallel to one another, wherein the multiple qubits are positioned between the first substrate and the second substrate.

14. The system of claim 12, wherein the one or more gates are arranged along a surface of a first substrate in a substantially rectangular pattern with at least one row and at least one column or in a substantially hexagonal pattern or a substantially diagonal pattern.

15. The system of claim 14, wherein the substantially rectangular pattern comprises four rows each having four gates and four columns each having four gates.

16. The system of claim 15, wherein each row of the four rows comprises two gates each comprising four qubits and two gates each comprising thirteen qubits, the gates of the row arranged alternately and each column of the four columns comprises two gates each comprising four qubits and two gates each comprising thirteen qubits, the gates of the column arranged alternately.

17. The system of claim 7, wherein the gates of the plurality of 3-D gates cells are arranged in a substantially rectangular pattern with at least one row and at least one column or in a substantially hexagonal pattern or a substantially diagonal pattern.

18. The system of claim 17, wherein the substantially rectangular pattern comprises four rows each having four gates and four columns each having four gates.

19. The system of claim 18, wherein each row of the four rows comprises two gates each comprising four qubits and two gates each comprising thirteen qubits, the gates of the row arranged alternately and each column of the four columns comprises two gates each comprising four qubits and two gates each comprising thirteen qubits, the gates of the column arranged alternately.

20. The system of claim 7, wherein, each qubit of a gate cell is configured to be quantum-mechanically entangled with at least one qubit of another gate cell.

* * * * *